(12) United States Patent
Izumi

(10) Patent No.: US 8,426,912 B2
(45) Date of Patent: Apr. 23, 2013

(54) SEMICONDUCTOR DEVICE AND METHOD OF MANUFACTURING SEMICONDUCTOR DEVICE

(75) Inventor: Naoki Izumi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 266 days.

(21) Appl. No.: 12/285,012

(22) Filed: Sep. 26, 2008

(65) Prior Publication Data
US 2009/0085109 A1 Apr. 2, 2009

(30) Foreign Application Priority Data

Sep. 27, 2007 (JP) ................... 2007-251828
Sep. 28, 2007 (JP) ................... 2007-255650
Sep. 5, 2008 (JP) ................... 2008-228501

(51) Int. Cl.
*H01L 27/88* (2006.01)
*H01L 21/8234* (2006.01)

(52) U.S. Cl.
USPC ......................................... 257/334; 257/333

(58) Field of Classification Search .................. 257/334, 257/333
See application file for complete search history.

(56) References Cited

U.S. PATENT DOCUMENTS

| | | | | |
|---|---|---|---|---|
| 4,767,722 A | * | 8/1988 | Blanchard | 438/270 |
| 4,983,544 A | * | 1/1991 | Lu et al. | 438/698 |
| 7,416,943 B2 | * | 8/2008 | Figura et al. | 438/259 |
| 2001/0030347 A1 | | 10/2001 | Yamauchi et al. | |
| 2002/0024091 A1 | * | 2/2002 | Mo | 257/330 |
| 2004/0099922 A1 | | 5/2004 | Yamaguchi | |
| 2005/0199951 A1 | * | 9/2005 | Shimizu et al. | 257/335 |
| 2006/0267088 A1 | * | 11/2006 | Sharp et al. | 257/341 |
| 2006/0292764 A1 | * | 12/2006 | Harada | 438/156 |
| 2007/0164353 A1 | * | 7/2007 | Mifuji et al. | 257/330 |
| 2008/0199997 A1 | * | 8/2008 | Grebs et al. | 438/270 |

FOREIGN PATENT DOCUMENTS

| | | |
|---|---|---|
| JP | 2001-267574 A | 9/2001 |
| JP | 2005-235913 | 9/2005 |

* cited by examiner

*Primary Examiner* — Matthew W Such
*Assistant Examiner* — Robert Carpenter
(74) *Attorney, Agent, or Firm* — Rabin & Berdo, P.C.

(57) ABSTRACT

A semiconductor device according to the present invention includes: a semiconductor layer of a first conductivity type; a body region of a second conductivity type formed in a surface layer portion of the semiconductor layer; a trench dug from the surface of the semiconductor layer to penetrate the body region; a source region of a first conductivity type formed on a side portion of the trench in a surface layer portion of the body region; a gate insulating film formed on the bottom surface and the side surface of the trench; a gate electrode embedded in the trench through the gate insulating film and so formed that the surface thereof is lower by one stage than the surface of the source region; and a peripheral wall film formed on a peripheral edge portion of the surface of the gate electrode to be opposed to an upper end portion of the side surface of the trench.

13 Claims, 36 Drawing Sheets

SEMICONDUCTOR DEVICE AND METHOD OF MANUFACTURING SEMICONDUCTOR DEVICE

BACKGROUND OF THE INVENTION

1. Field of the Invention

The present invention relates to a semiconductor device having a trench gate VDMOSFET (Vertical Double diffused Metal Oxide Semiconductor Field-Effect Transistor) and a method of manufacturing the same.

2. Description of Related Art

A VDMOSFET (trench gate VDMOSFET) employing a trench gate structure is generally known as a MOSFET having a high withstand voltage.

FIG. 10 is a schematic sectional view of a conventional semiconductor device 101 having a trench gate VDMOSFET.

The semiconductor device 101 includes an $N^+$-type substrate 102. An $N^-$-type epitaxial layer 103 is stacked on the $N^+$-type substrate 102. A $P^-$-type body region 104 is formed in a surface layer portion of the epitaxial layer 103.

A trench 105 is dug in the epitaxial layer 103 from the surface thereof. The trench 105 penetrates the body region 104, so that the deepest portion thereof reaches the epitaxial layer 103 under the body region 104. A gate electrode 107 made of polysilicon doped with an N-type impurity in a high concentration is embedded in the trench 105 through a gate insulating film 106.

$N^+$-type source regions 108 are formed in a surface layer portion of the body region 104 along the trench 105. A $P^+$-type contact region 109 is formed on each $N^+$-type source region 108 to penetrate the $N^+$-type source region 108.

A drain electrode 110 is formed on the back surface of the $N^+$-type substrate 102.

When the source region 108 and the body contact region 109 are grounded and the potential of the gate electrode 107 is controlled while a positive voltage of a proper level is applied to the drain electrode 110, a channel is formed in the vicinity of the interface between the body region 104 and the gate insulating film 106, and a current flows between the source region 108 and the drain electrode 110.

In the steps of manufacturing the semiconductor device 101, a silicon oxide film is formed on the surface of the epitaxial layer 103 including the inner surface of the trench 105. Then, the gate electrode 107 made of doped polysilicon is formed on the silicon oxide film in the trench 105. Thereafter HF (hydrofluoric acid) is supplied to the surface of the portion of the silicon oxide film located outside the trench 105 to remove this portion of the silicon oxide film in advance of ion implantation for forming the $N^+$-type source region 108. At this time, the upper end portion of the silicon oxide film located in the trench 105, i.e., the upper end portion of the gate insulating film 106 is also removed by HF, to result in a portion where the gate electrode 107 and the $N^+$-type source region 108 are opposed to each other without through the gate insulating film 106. In the conventional semiconductor device, therefore, the withstand voltage (gate-to-source withstand voltage) between the gate electrode 107 and the $N^+$-type source region 108 is disadvantageously reduced.

The body region 104 is formed by implanting (ions of) a P-type impurity into the epitaxial layer 103 from the surface thereof and thereafter drive-in-diffusing the P-type impurity. Thus, the body region 104 has such an impurity concentration profile that the P-type impurity concentration is extremely low in the vicinity of the interface between the body region 104 and the epitaxial layer 103 under the body region 104 and higher on the surface layer side. Therefore, a depletion layer largely spreads toward the source region 108, to easily cause the so-called punch through.

If the trench gate VDMOSFET is provided on the $N^+$-type substrate 102 mixedly with a planar gate MOSFET, however, the portion for forming the body region 104 must be selectively of the P type, and hence the body region 104 must inevitably be formed by implanting the P-type impurity into the epitaxial layer 103 and diffusing the same.

SUMMARY OF THE INVENTION

A first object of the present invention is to provide a semiconductor device and a method of manufacturing the same, capable of improving a gate-to-source withstand voltage.

A second object of the present invention is to provide a method of manufacturing a semiconductor device and a semiconductor device manufactured by this method, capable of forming a body region of a VDMOSFET provided mixedly with a planar gate MOSFET so that a bottom portion thereof has an impurity concentration generally identical to that of a surface layer portion.

A semiconductor device according to one aspect of the present invention includes: a semiconductor layer of a first conductivity type; a body region of a second conductivity type formed on a surface layer portion of the semiconductor layer; a trench dug from the surface of the semiconductor layer to penetrate the body region; a source region of a first conductivity type formed on a side portion of the trench in a surface layer portion of the body region; a gate insulating film formed on the bottom surface and the side surface of the trench; a gate electrode embedded in the trench through the gate insulating film and so formed that the surface thereof is lower by one stage than the surface of the source region; and a peripheral wall film formed on a peripheral edge portion of the surface of the gate electrode to be opposed to an upper end portion of the side surface of the trench.

According to this structure, the body region of the second conductivity type is formed in the surface layer portion of the semiconductor layer of the first conductivity type. The trench is dug in the semiconductor layer from the surface thereof, to penetrate the body region. In the surface layer portion of the body region, the source region of the first conductivity type is formed on the side of the trench. The gate insulating film is formed on the bottom surface and the side surface of the trench. The gate electrode is embedded in the trench through the gate insulating film. The surface of the gate electrode is lower by one stage than the surface of the source region. The peripheral wall film opposed to the upper end portion of the side surface of the trench is formed on the peripheral edge portion of the surface of the gate electrode. Thus, at least the peripheral wall film is interposed between the gate electrode and the source region. Therefore, the gate-to-source withstand voltage can be improved as compared with the structure (see FIG. 10) having the portion where the gate electrode and the source region are opposed to each other without through the gate insulating film.

A trench gate VDMOSFET including the semiconductor layer, the body region, the source region, the gate insulating film and the gate electrode may be provided on the semiconductor layer mixedly with a planar gate MOSFET (Metal Oxide Semiconductor Field-Effect Transistor). In this case, an element isolation portion isolating a first element forming region and a second element forming region from each other is formed on the surface of the semiconductor layer. The trench gate VDMOSFET is formed in the first element forming region. The planar gate MOSFET is formed in the second element forming region.

The planar gate MOSFET includes a planar gate electrode formed on the surface of the semiconductor layer in the second element forming region. A sidewall covering the overall periphery of the side surface of the planar gate electrode may be formed on the periphery of the planar gate electrode.

The semiconductor device having this structure can be manufactured by a method of manufacturing a semiconductor device including the steps of: forming a trench dug from the surface of a semiconductor layer of a first conductivity type in a first element forming region on which the trench gate VDMOSFET is formed; forming a trench gate electrode having a surface lower by one stage than the surface of the semiconductor layer in the trench; forming a planar gate electrode on the surface of the semiconductor layer in a second element forming region on which the planar gate MOSFET is formed; forming a deposition layer of an insulating material on the surface of the semiconductor layer, the trench gate electrode and the planar gate electrode after the formation of the trench gate electrode and the planar gate electrode; and forming a peripheral wall film and a sidewall by partially leaving the deposition layer on a peripheral edge portion of the surface of the trench gate electrode and a side portion of the planar gate electrode respectively by etching back the deposition layer.

According to this method, the peripheral wall film can be formed on the peripheral edge portion of the surface of the trench gate electrode in parallel with the formation of the sidewall.

This method may further include the steps of: forming a body region recess for forming a body region of the trench gate VDMOSFET on the semiconductor layer in the first element forming region; and embedding a semiconductor material of a second conductivity type in the body region recess by epitaxy or CVD (Chemical Vapor Deposition).

The semiconductor material of the second conductivity type is embedded in the body region recess by epitaxy or CVD. Therefore, the body region consisting of the semiconductor material embedded in the body region recess has a generally uniform impurity concentration in the depth direction (thickness direction). Thus, the bottom portion of the body region has an impurity concentration generally identical to that of the surface layer portion. Therefore, the impurity concentration of the bottom portion can be increased without increasing the peak concentration (peak value of the impurity concentration) of the body region as compared with a case of forming the body region by implantation and diffusion of an impurity. Consequently, spreading of a depletion layer from the interface between the semiconductor layer of the first conductivity type and the body region of the second conductivity type toward the body region can be suppressed, whereby the width (depth) of the depletion layer formed in the body region can be reduced.

The width of the depletion layer formed in the body region can be so reduced that the depth of the body region can be reduced. Thus, the depth of the trench formed to penetrate the body region can be reduced, whereby portions around the upper and lower ends of the trench can be prevented from action of remarkable stress, and occurrence of crystal defects resulting from stress can be prevented. Further, the channel length (gate length) can be so reduced that the on-resistance of the trench gate VDMOSFET can be reduced.

This method may further include a step of forming a well region recess for forming a well region of the planar gate MOSFET on the semiconductor layer in the second element forming region, and the semiconductor material may be embedded in the well region recess in parallel with the embedding of the semiconductor material in the body region recess.

In this case, the well region of the planar gate MOSFET can be formed in the same step as the body region of the trench gate VDMOSFET.

The planar gate MOSFET may include an N-channel MOSFET and a P-channel MOSFET. In this case, the semiconductor device further includes a deep well region of a second conductivity type formed in the surface layer portion of the semiconductor layer in the second element forming region, a first well region of a first conductivity type formed in a surface layer portion of the deep well region, and a second well region of a second conductivity type formed in the surface layer portion of the deep well region isolatedly from the first well region.

A semiconductor device according to another aspect of the present invention includes: a semiconductor layer of a first conductivity type; a body region of a second conductivity type formed on a surface layer portion of the semiconductor layer in a first element forming region on which a VDMOSFET is formed; and a well region of a second conductivity type formed in the surface layer portion of the semiconductor layer in a second element forming region on which a planar gate MOSFET is formed. The body region and the well region have the same impurity concentration profiles, with generally uniform impurity concentrations in the depth directions respectively.

The semiconductor device having this structure can be manufactured by a method of manufacturing a semiconductor device including the steps of: forming a semiconductor layer of a first conductivity type by epitaxy; forming a body region recess for forming a body region of the VDMOSFET on the semiconductor layer; and embedding a semiconductor material of a second conductivity type in the body region recess by epitaxy or CVD (Chemical Vapor Deposition).

According to this method, the semiconductor layer of the first conductivity type is formed, and the body region recess is thereafter formed in the portion of the surface of the semiconductor layer for forming the body region of the VDMOSFET. Thereafter the semiconductor material of the second conductivity type is embedded in the body region recess by epitaxy or CVD. Thus, the body region consisting of the semiconductor material embedded in the body region recess is obtained on the surface layer portion of the semiconductor layer.

The semiconductor material is embedded in the body region recess by epitaxy or CVD. Therefore, the body region consisting of the semiconductor material embedded in the body region recess has a generally uniform impurity concentration in the depth direction (thickness direction). Thus, the bottom portion of the body region has an impurity concentration generally identical to that of the surface layer portion. Therefore, the impurity concentration of the bottom portion can be increased without increasing the peak concentration (peak value of the impurity concentration) of the body region as compared with a case of forming the body region by implantation and diffusion of an impurity. Consequently, spreading of a depletion layer from the interface between the semiconductor layer of the first conductivity type and the body region of the second conductivity type toward the body region can be suppressed, whereby the width (depth) of the depletion layer formed in the body region can be reduced.

The width of the depletion layer formed in the body region can be so reduced that the depth of the body region can be reduced. Thus, the depth of the trench formed to penetrate the body region can be reduced, whereby portions around the upper and lower ends of the trench can be prevented from action of remarkable stress, and occurrence of crystal defects resulting from stress can be prevented. Further, the channel length (gate length) can be so reduced that the on-resistance of the VDMOSFET can be reduced.

This method may further include a step of forming a well region recess for forming a well region of the planar gate MOSFET on the semiconductor layer, and the semiconductor material may be embedded in the well region recess in parallel with the embedding of the semiconductor material in the body region recess.

In this case, the well region of the planar gate MOSFET can be formed in the same step as the body region of the VDMOSFET.

This method may be replaced with another method of manufacturing a semiconductor device including the steps of: forming a first semiconductor layer of a first conductivity type by epitaxy; forming a second semiconductor layer of a second conductivity type on the first semiconductor layer by epitaxy or CVD; and forming a body region of a second conductivity type of the VDMOSFET and a well region of a second conductivity type of the planar gate MOSFET isolatedly from each other by selectively implanting a first conductivity type impurity into the second semiconductor layer.

According to this method, the first semiconductor layer of the first conductivity type is formed, and the semiconductor layer of the second conductivity type is thereafter formed on the first semiconductor layer by epitaxy or CVD. Thereafter the body region of the second conductivity type of the VDMOSFET and the well region of the second conductivity type of the planar gate MOSFET are formed isolatedly from each other by selectively implanting the first conductivity type impurity into the second semiconductor layer.

The second semiconductor layer formed by epitaxy or CVD has a generally uniform impurity in the depth direction (thickness direction) thereof. Therefore, the bottom portion of the body region consisting of part of the second semiconductor layer has an impurity concentration generally identical to that of the surface layer portion. Therefore, the impurity concentration of the bottom portion can be increased without increasing the peak concentration (peak value of the impurity concentration) of the body region as compared with a case of forming the body region by implantation and diffusion of an impurity. Consequently, spreading of a depletion layer from the interface between the first semiconductor layer of the first conductivity type and the body region of the second conductivity type toward the body region can be suppressed, whereby the width (depth) of the depletion layer formed in the body region can be reduced.

The width of the depletion layer formed in the body region can be so reduced that the depth of the body region can be reduced. Thus, the depth of the trench formed to penetrate the body region can be reduced, whereby portions around the upper and lower ends of the trench can be prevented from action of remarkable stress, and occurrence of crystal defects resulting from stress can be prevented. Further, the channel length (gate length) can be so reduced that the on-resistance of the VDMOSFET can be reduced.

In addition, the well region of the planar gate MOSFET can be formed in the same step as the body region of the VDMOSFET, whereby the manufacturing steps can be simplified.

The foregoing and other objects, features and effects of the present invention will become more apparent from the following detailed description of the embodiments with reference to the attached drawings.

DETAILED DESCRIPTION OF THE INVENTION

Figure 1:
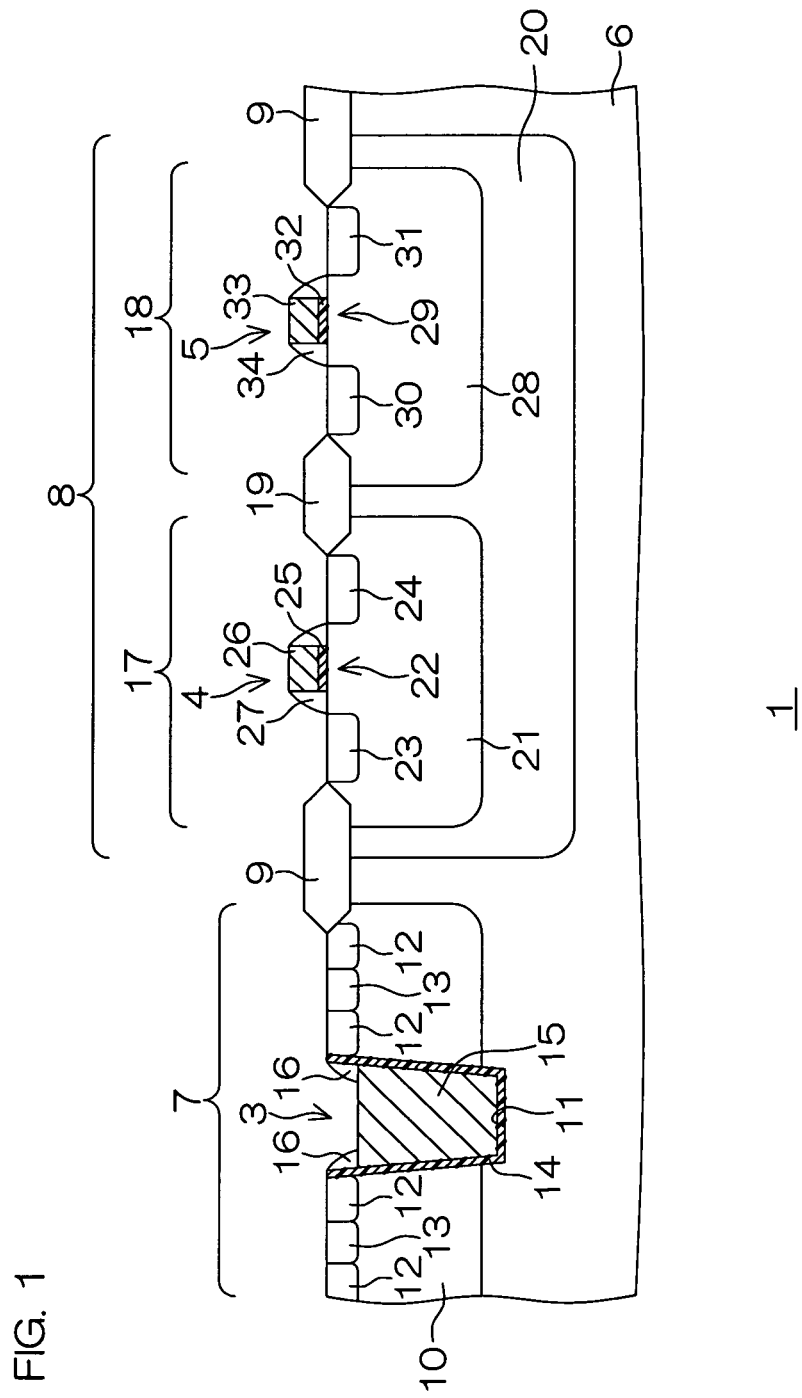
FIG. 1 is a schematic sectional view showing the structure of a semiconductor device according to a first embodiment of the present invention.

FIG. 1 is a schematic sectional view showing the structure of a semiconductor device 1 according to a first embodiment of the present invention.

The semiconductor device 1 includes a trench gate VDMOSFET 3 (hereinafter referred to as "VDMOSFET 3"), a planar gate N-channel MOSFET 4 (hereinafter referred to as "NMOSFET 4") and a planar gate P-channel MOSFET 5 (hereinafter referred to as "PMOSFET 5") on an N$^+$-type (high-concentration N-type) substrate (not shown) made of silicon.

An N-type epitaxial layer 6 made of silicon is formed on the semiconductor substrate. A LOCOS oxide film 9 for isolating a VDMOS forming region 7 and a CMOS forming region 8 from each other is formed on the surface of the epitaxial layer 6.

The VDMOSFET 3 is formed in the VDMOS forming region 7.

In the VDMOS forming region 7, a P-type body region 10 is formed in a surface layer portion of the epitaxial layer 6. In the VDMOS forming region 7, further, a trench 11 is dug in the epitaxial layer 6 from the surface thereof. The trench 11 penetrates the body region 10, so that the deepest portion thereof reaches the epitaxial layer 6 under the body region 10. The trench 11 extends in a direction (along the gate width) perpendicular to the plane of FIG. 1.

In a surface layer portion of the body region 10, $N^+$-type source regions 12 are formed on both sides of the trench 11 in a direction (horizontal direction in FIG. 1) orthogonal to the gate width. Each source region 12 extends along the trench 11 in the direction along the gate width. A $P^+$-type body contact region 13 is formed at the center of the source region 12 in the direction orthogonal to the gate width, to penetrate the source region 12.

A gate insulating film 14 made of $SiO_2$ (siliconoxide) is formed on the bottom surface and the side surface of the trench 11. A gate electrode 15 made of polysilicon doped with an N-type impurity in a high concentration is embedded in the trench 11 through the gate insulating film 14. The gate electrode 15 is so formed that the surface thereof is lower by one stage than the surface of the source region 12 (surface of the epitaxial layer 6). A peripheral wall film 16 made of SiN (silicon nitride) or $SiO_2$ and opposed to the upper end portion of the side surface of the trench 11 is formed on the peripheral edge portion of the surface of the gate electrode 15.

Figure 10:
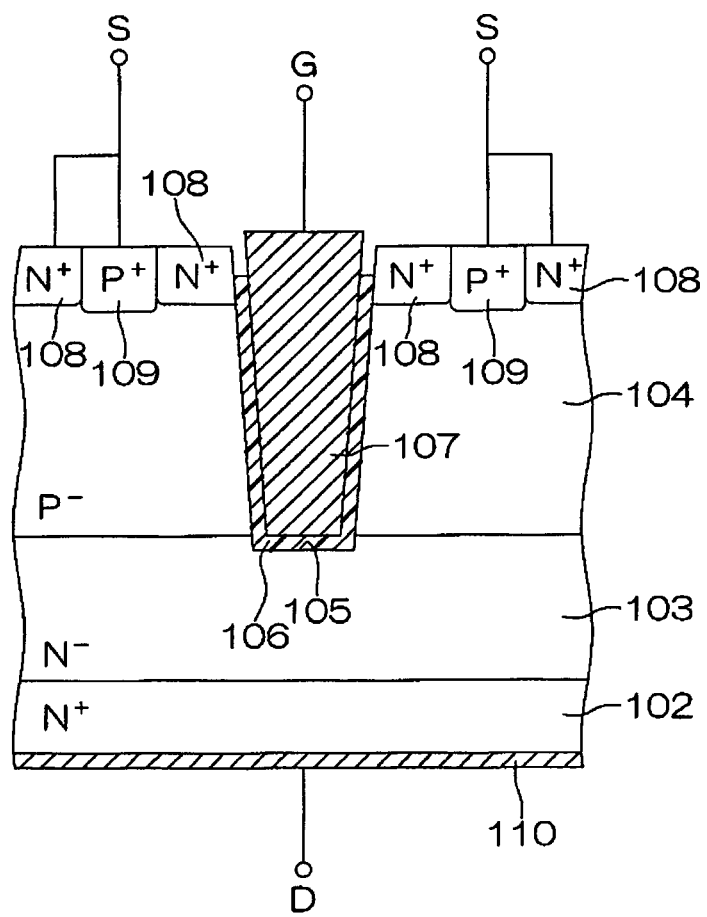
FIG. 10 is a schematic sectional view showing the structure of a conventional semiconductor device.

Thus, at least the peripheral wall film 16 is interposed between the gate electrode 15 and the source region 12. Therefore, the gate-to-source withstand voltage can be improved as compared with the structure shown in FIG. 10.

The NMOSFET 4 and the PMOSFET 5 are formed in the CMOS forming region 8. More specifically, a LOCOS oxide film 19 for isolating an NMOS forming region 17 and a PMOS forming region 18 from each other is formed on the surface of the epitaxial layer 6 in the CMOS forming region 8. The NMOSFET 4 and the PMOSFET 5 are formed in the NMOS forming region 17 and the PMOS forming region 18 respectively.

In the CMOS forming region 8, a P-type deep well region 20 is formed in the surface layer portion of the epitaxial layer 6. The deep well region 20 has a larger depth than the body region 10.

In the NMOS forming region 17, a P-type well region 21 is formed on a surface layer portion of the deep well region 20. $N^+$-type source and drain regions 23 and 24 are formed in a surface layer portion of the P-type well region 21 through a channel region 22.

A gate insulating film 25 made of $SiO_2$ is formed on the channel region 22. A gate electrode 26 made of polysilicon doped with an N-type impurity in a high concentration is formed on the gate insulating film 25. A sidewall 27 made of SiN or $SiO_2$ is formed on the periphery of the gate electrode 26. The sidewall 27 covers the overall side surfaces of the gate insulating film 25 and the gate electrode 26.

In the PMOS forming region 18, an N-type well region 28 is formed in the surface layer portion of the deep well region 20. $P^+$-type source and drain regions 30 and 31 are formed in a surface layer portion of the N-type well region 28 through a channel region 29.

A gate insulating film 32 made of $SiO_2$ is formed on the channel region 29. A gate electrode 33 made of polysilicon doped with an N-type impurity in a high concentration is formed on the gate insulating film 32. A sidewall 34 made of SiN or $SiO_2$ is formed on the periphery of the gate electrode 33. The sidewall 34 covers the overall side surfaces of the gate insulating film 32 and the gate electrode 33.

Figure 2A:
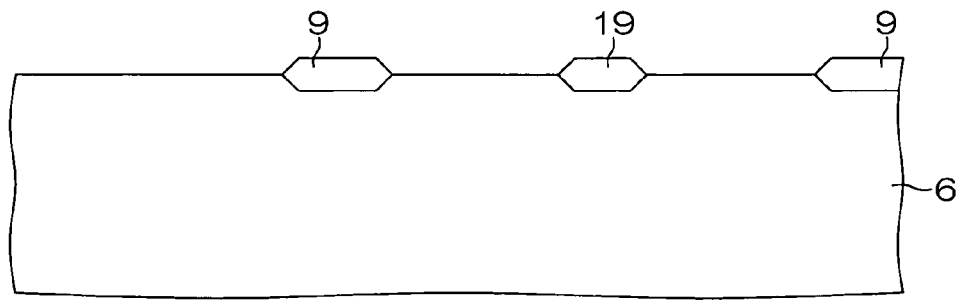
FIG. 2A is a schematic sectional view for illustrating a method of manufacturing the semiconductor device shown in FIG. 1.
Figure 2B:
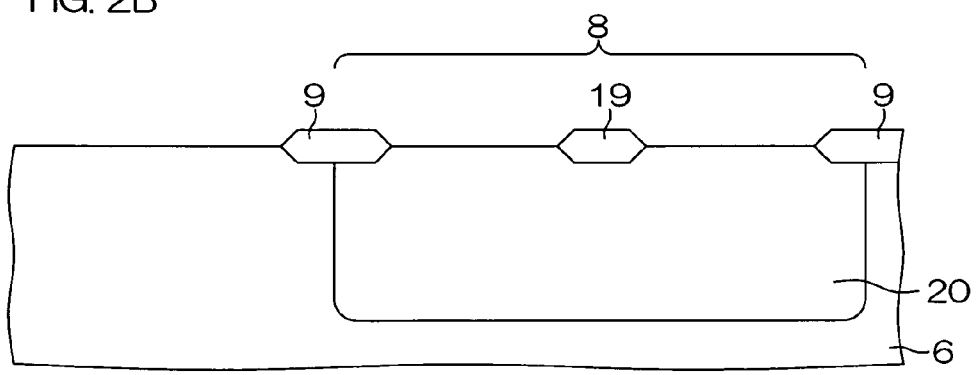
FIGS. 2B to 2N are schematic sectional views successively showing the steps subsequent to the step shown in FIG. 2A.
Figure 2C:
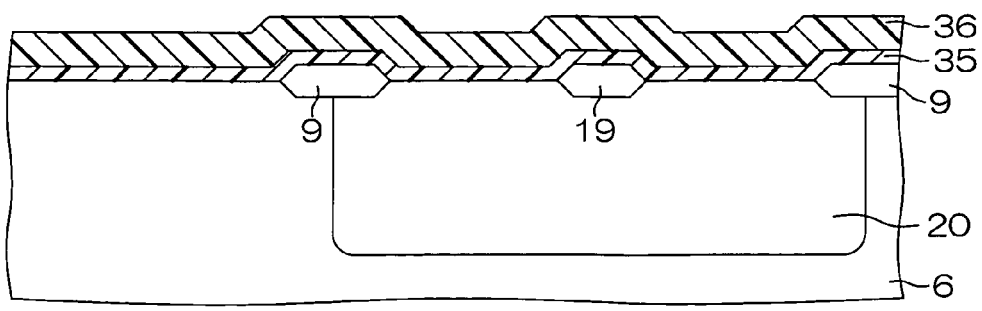
Figure 2D:
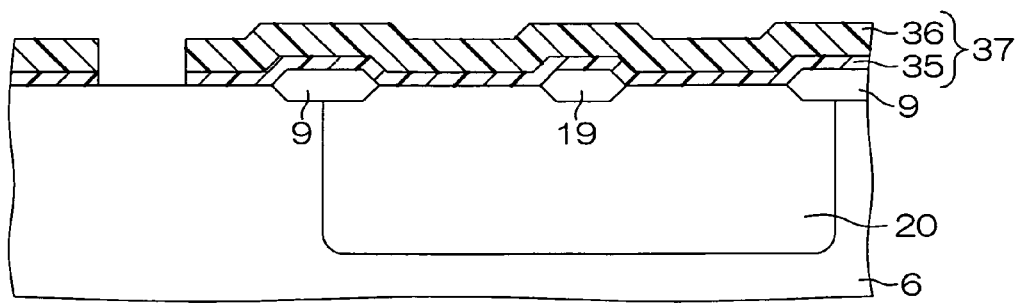
Figure 2E:
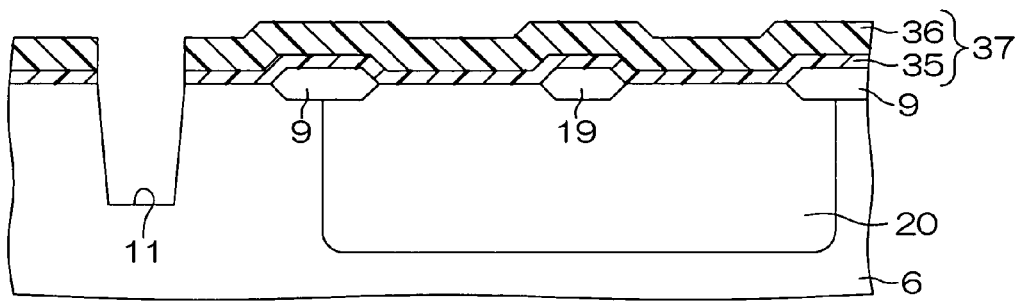
Figure 2F:
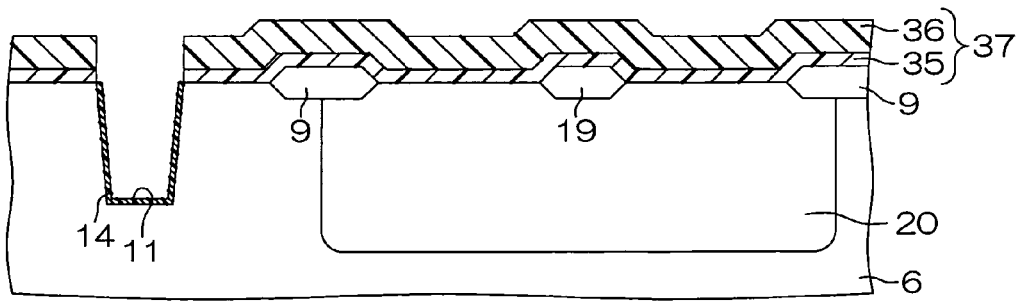
Figure 2G:
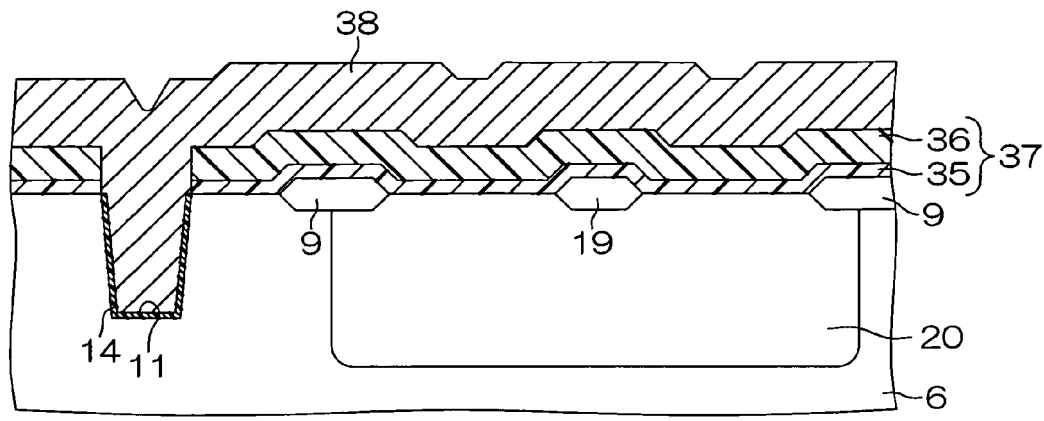
Figure 2H:
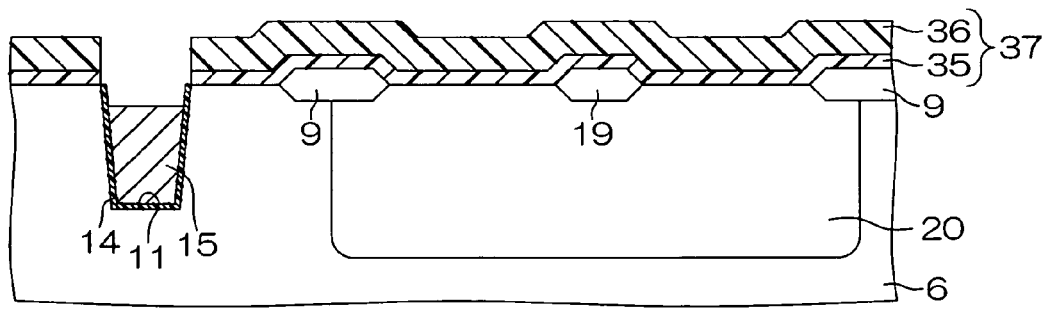
Figure 2I:
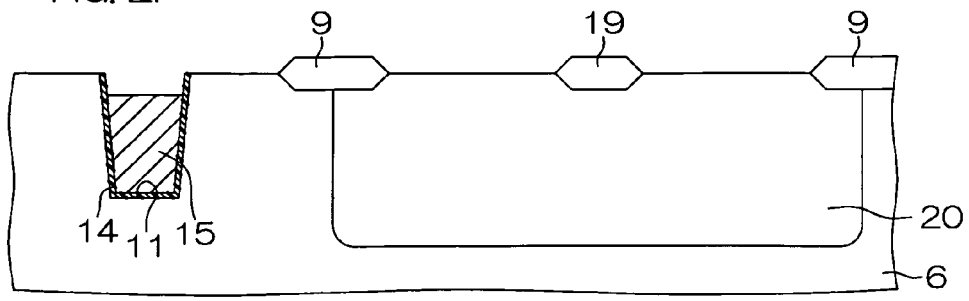
Figure 2J:
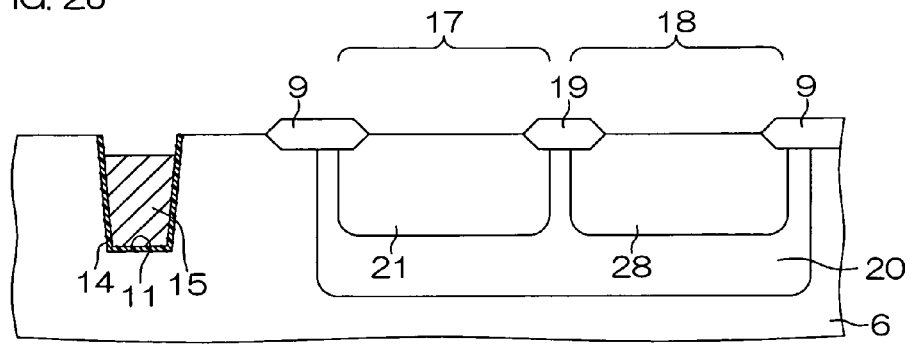
Figure 2K:
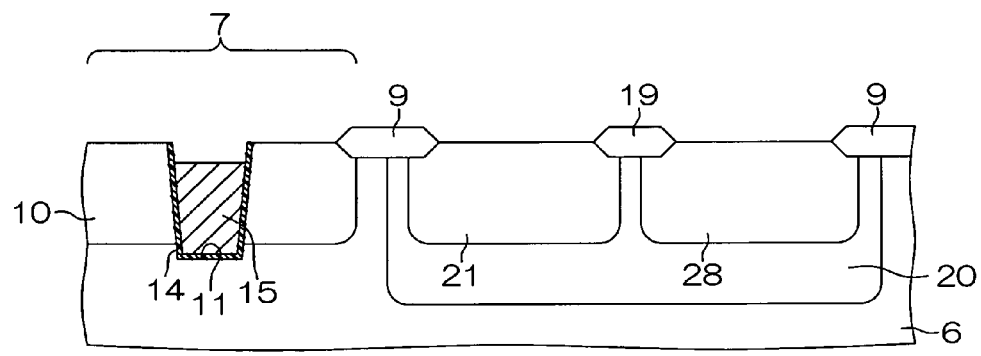
Figure 2L:
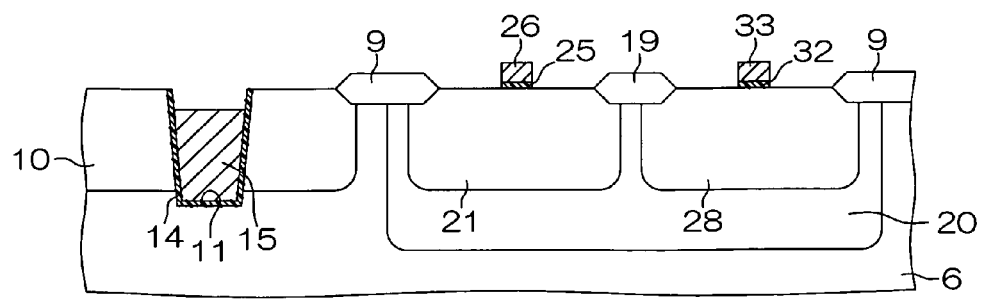
Figure 2M:
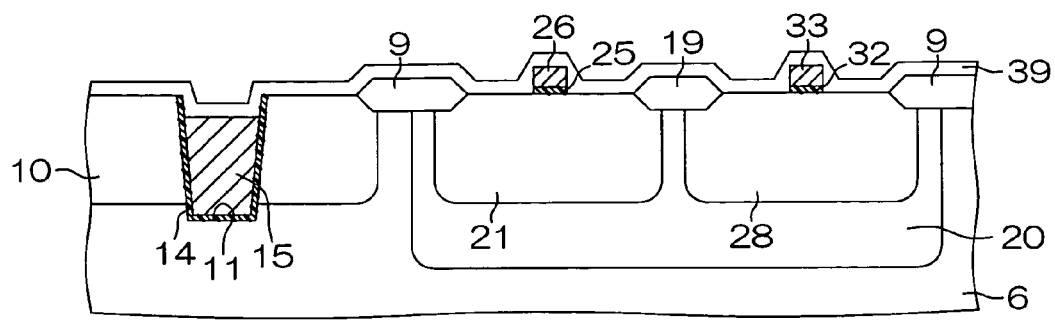
Figure 2N:
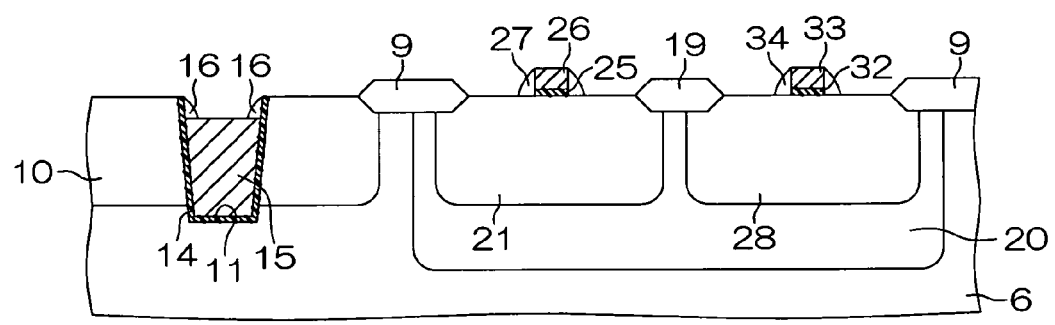

FIGS. 2A to 2N are schematic sectional views for illustrating a method of manufacturing the semiconductor device 1 shown in FIG. 1.

First, LOCOS oxide films 9 and 19 are selectively formed on the surface of the epitaxial layer 6 by LOCOS, as shown in FIG. 2A.

Then, a resist film (not shown) having an opening opposed to the CMOS forming region 8 is formed on the epitaxial layer 6 by photolithography, as shown in FIG. 2B. Then, a P-type impurity (boron ions, for example) is implanted into the epitaxial layer 6 from the surface thereof through the resist film serving as a mask, thereby forming the deep well region 20. The resist film is removed after the implantation of the P-type impurity.

Then, a sacrificial oxide film 35 made of $SiO_2$ is formed on the surface of the epitaxial layer 6 by thermal oxidation, as shown in FIG. 2C. Thereafter an SiN layer 36 is formed on the sacrificial oxide film 35 by CVD (Chemical Vapor Deposition).

The sacrificial oxide film 35 and the SiN layer 36 are patterned by photolithography, to form a hard mask 37 having an opening opposed to the portion for forming the trench 11, as shown in FIG. 2D.

Thereafter the epitaxial layer 6 is etched through the hard mask 37, thereby forming the trench 11 as shown in FIG. 2E.

Then, thermal oxidation is performed while leaving the hard mask 37 on the epitaxial layer 6 thereby forming the gate insulating film 14 on the inner surface of the trench 11, as shown in FIG. 2F.

Then, a deposition layer 38 of polysilicon doped with an N-type impurity in a high concentration is formed on the gate insulating film 14 by CVD, as shown in FIG. 2G. The trench 11 is filled up with the deposition layer 38 of polysilicon.

Then, the portion of the deposition layer 38 of polysilicon located outside the trench 11 is removed by etch-back. This etch-back of the deposition layer 38 of polysilicon is continued until the surface of the deposition layer 38 of polysilicon embedded in the trench 11 becomes lower by 0.2 μm to 0.3 μm than the surface of the epitaxial layer 6. Consequently, the gate electrode 15 embedded in the trench 11 through the gate insulating film 14 is obtained, as shown in FIG. 2H.

Then, the hard mask 37 is removed, as shown in FIG. 2I. Thus, the surface of the epitaxial layer 6 is exposed.

Thereafter a resist film (not shown) having an opening opposed to the PMOS forming region 18 is formed on the epitaxial layer 6 by photolithography. Then, an N-type impurity (phosphorus ions, for example) is implanted into the epitaxial layer 6 from the surface thereof through the resist film serving as a mask, thereby forming the N-type well region 28, as shown in FIG. 2J. The resist film is removed after the implantation of the N-type impurity.

Another resist film (not shown) having an opening opposed to the NMOS forming region 17 is formed on the epitaxial layer 6 by photolithography. Then, a P-type impurity is implanted into the epitaxial layer 6 from the surface thereof through the resist film serving as a mask, thereby forming the P-type well region 21, as shown in FIG. 2J. The resist film is removed after the implantation of the P-type impurity.

Then, still another resist film (not shown) having an opening opposed to the VDMOS forming region 7 is formed on the epitaxial layer 6 by photolithography, as shown in FIG. 2K. Then, a P-type impurity is implanted into the epitaxial layer 6 from the surface thereof through the resist film serving as a mask, thereby forming the body region 10. The resist film is removed after the implantation of the P-type impurity.

Thereafter an $SiO_2$ film (not shown) is formed on the surface of the epitaxial layer 6 by thermal oxidation. Then, a polysilicon film (not shown) is formed on the SiO$_2$ film by thermal CVD. Thereafter the SiO$_2$ film and the polysilicon film are selectively removed by photolithography and etching. Thus, the gate insulating films 25 and 32 and the gate electrodes 26 and 33 are formed as shown in FIG. 2L.

Then, an SiN film (or an SiO$_2$ film) 39 is formed on the gate electrodes 15, 26 and 33, the LOCOS oxide films 9 and 19 and the epitaxial layer 6 by CVD, as shown in FIG. 2M.

Thereafter the SiN film 39 is etched back. Thus, the SiN film 39 remains on the peripheries of the gate electrodes 26 and 33 to form the sidewalls 27 and 34 consisting of the residual portions of the SiN film 39, as shown in FIG. 2N. The SiN film 39 also remains on the peripheral edge portion of the surface of the gate electrode 15, to form the peripheral wall film 16 consisting of the residual portion of the SiN film 39.

Thereafter an N-type impurity is implanted in a high concentration into the portions for forming the source regions 12 and 23 and the drain region 24. Further, a P-type impurity is implanted in a high concentration into the portions for forming the body contact region 13, the source region 30 and the drain region 31. Thus, the source regions 12, 23 and 30, the drain regions 24 and 31 and the body contact region 13 are formed, and the semiconductor device 1 having the structure shown in FIG. 1 is obtained.

According to this method, the peripheral wall film 16 can be formed in the same step as the sidewalls 27 and 34.

In addition to the aforementioned treatments, annealing for activating ions etc. is properly performed if necessary.

Figure 3A:
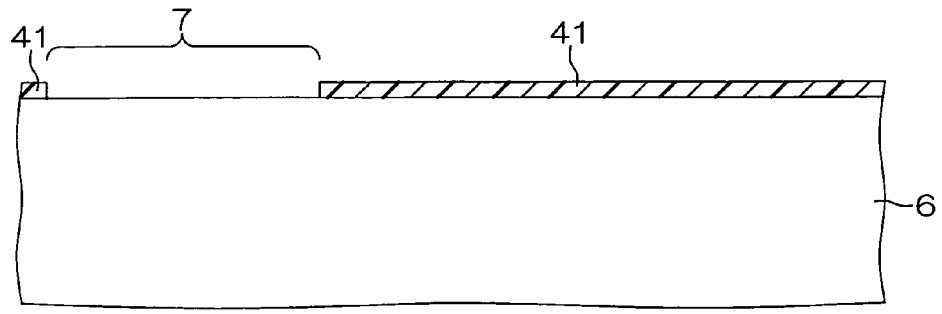
FIG. 3A is a schematic sectional view for illustrating another method of manufacturing the semiconductor device shown in FIG. 1.
Figure 3B:
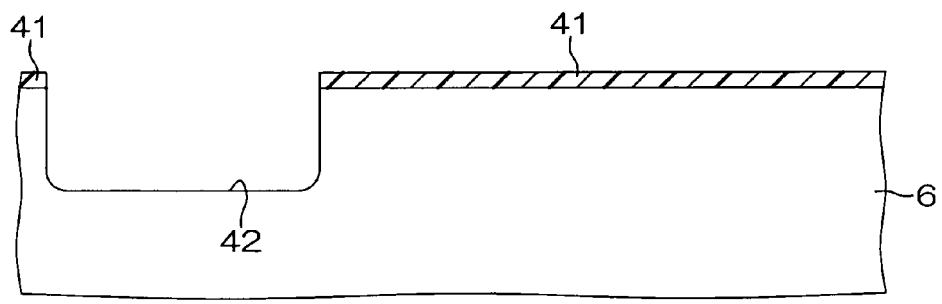
FIGS. 3B to 3R are schematic sectional views successively showing the steps subsequent to the step shown in FIG. 3A.
Figure 3C:
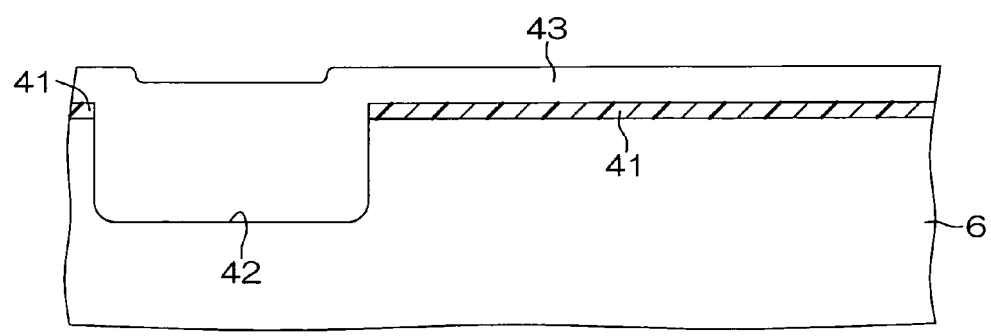
Figure 3D:
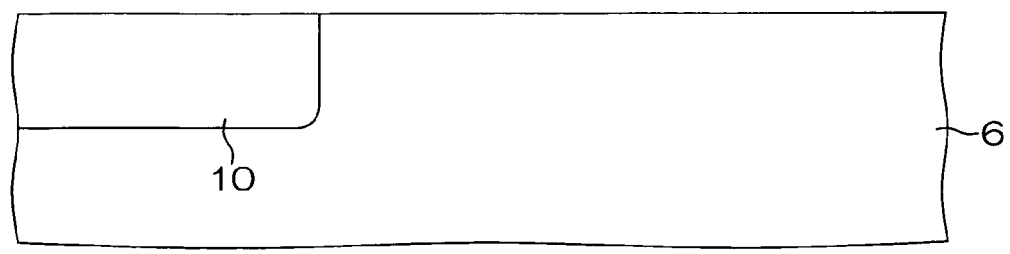
Figure 3E:
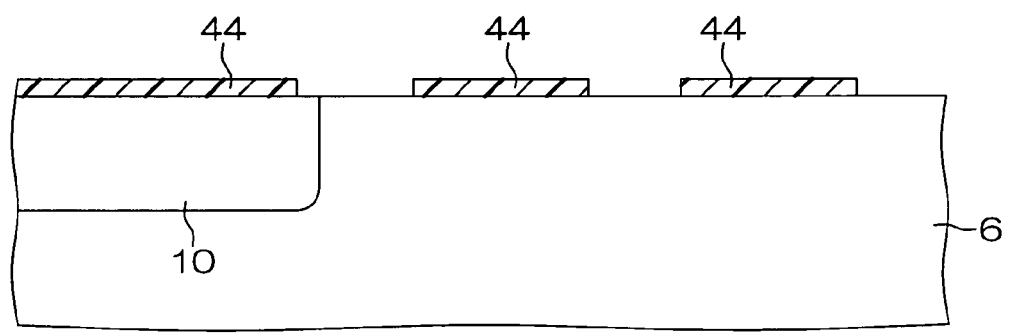
Figure 3F:
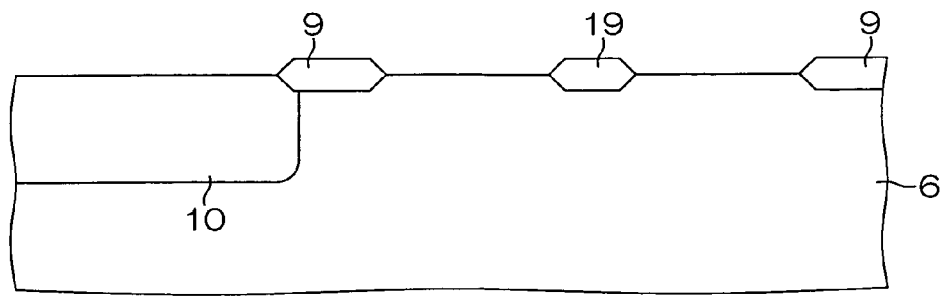
Figure 3G:
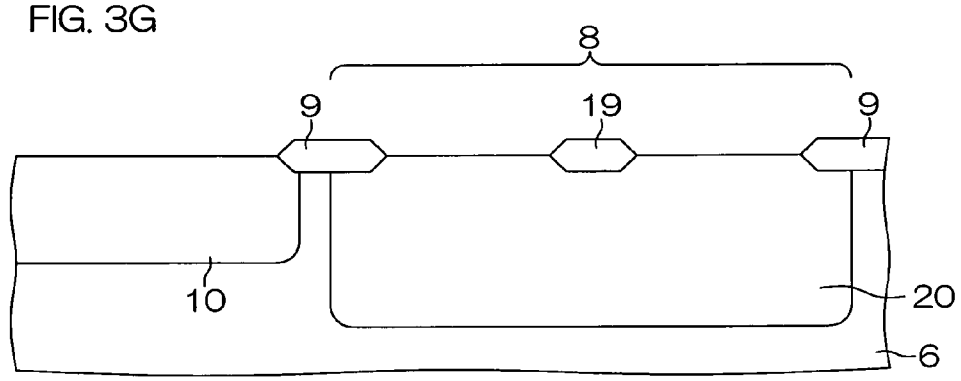
Figure 3H:
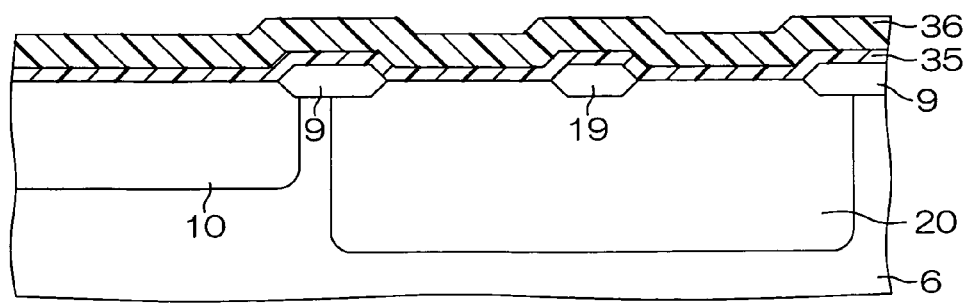
Figure 3I:
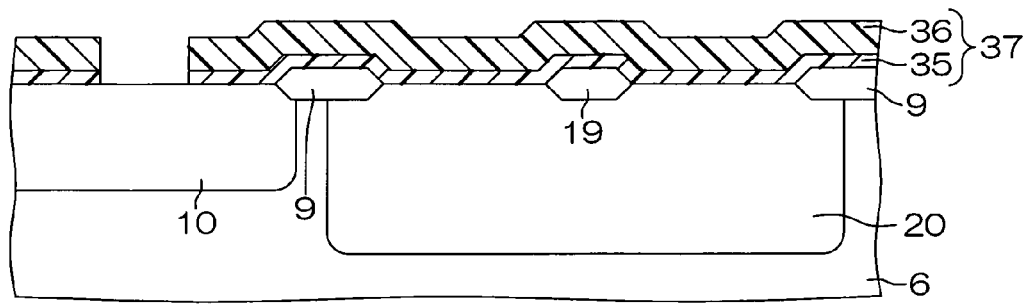
Figure 3J:
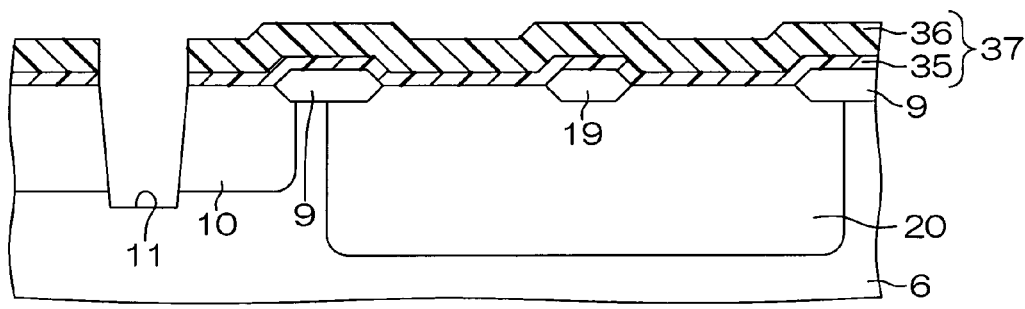
Figure 3K:
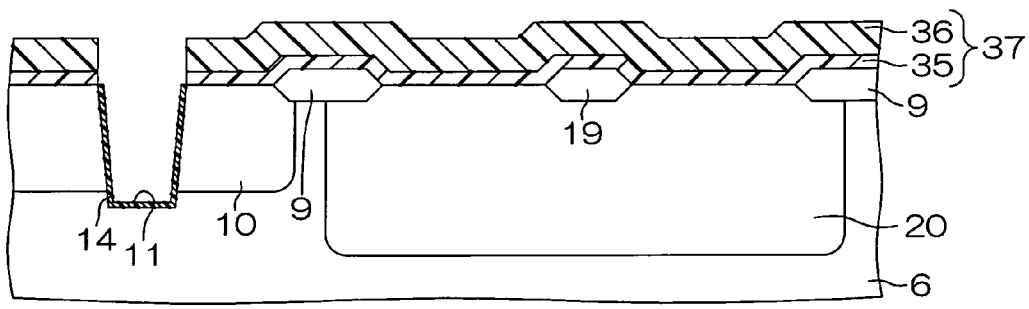
Figure 3L:
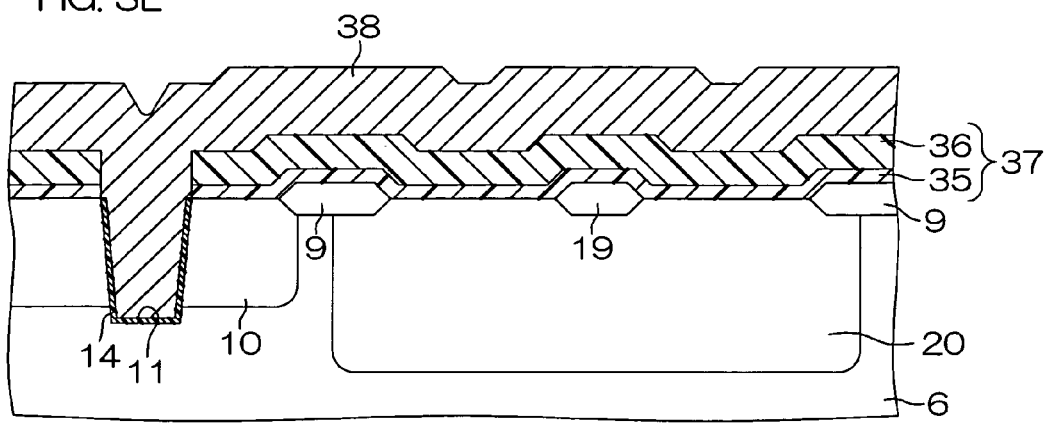
Figure 3M:
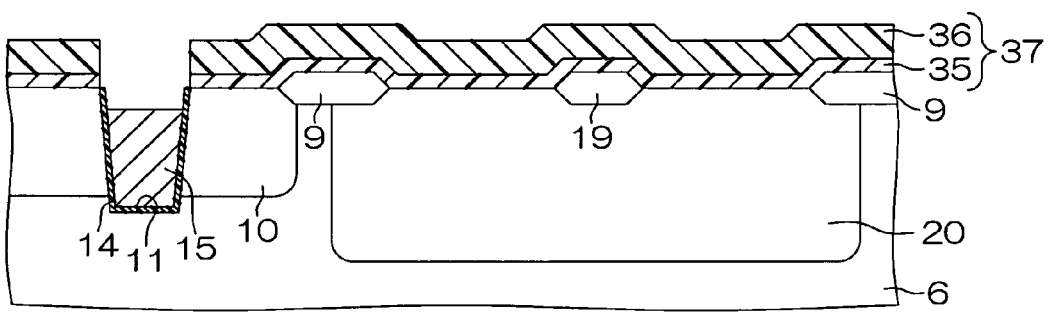
Figure 3N:
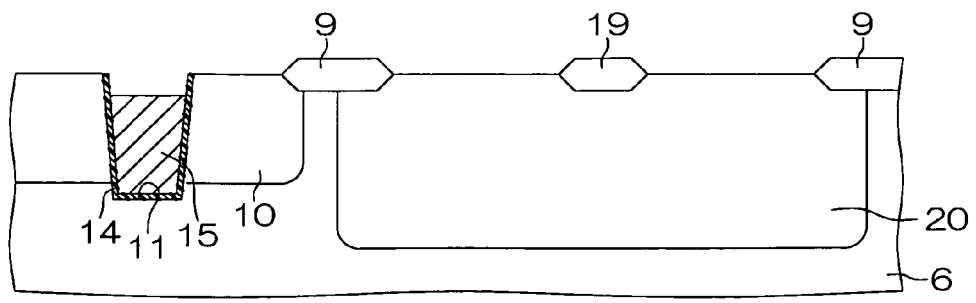
Figure 3O:
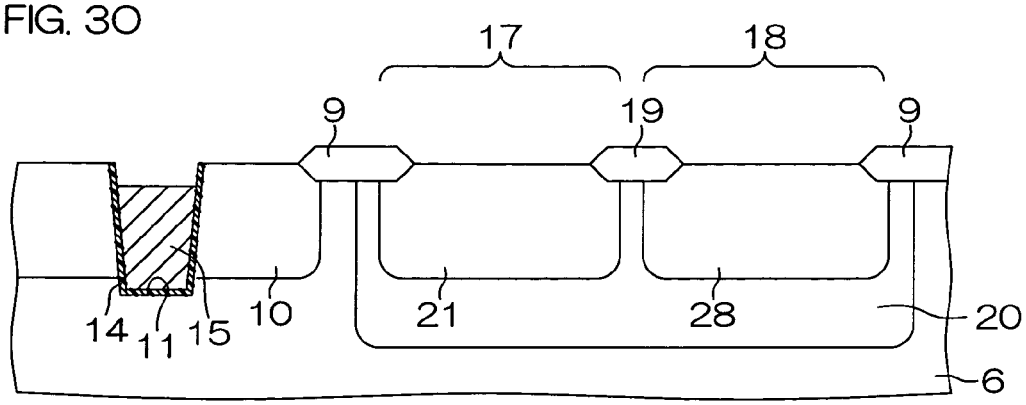
Figure 3P:
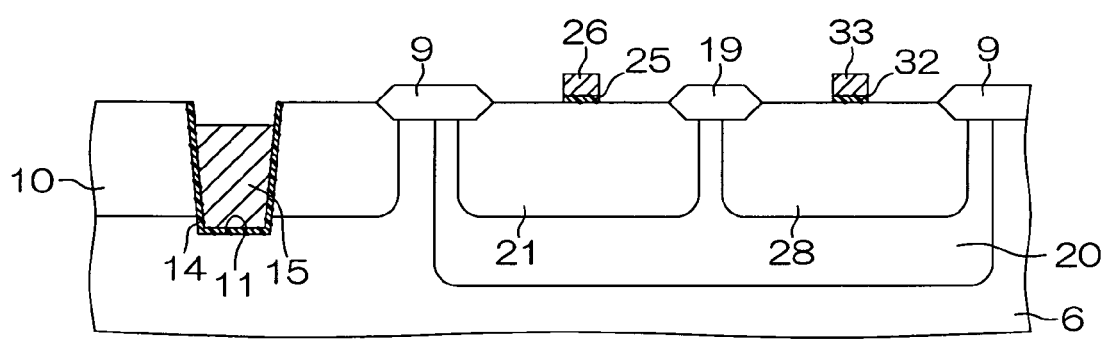
Figure 3Q:
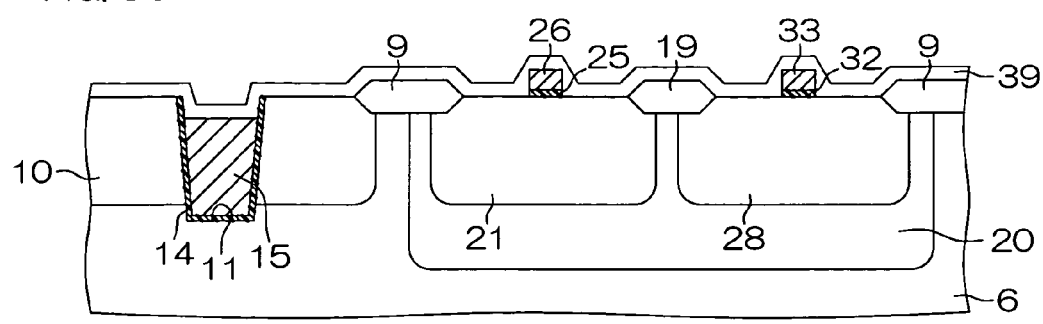
Figure 3R:
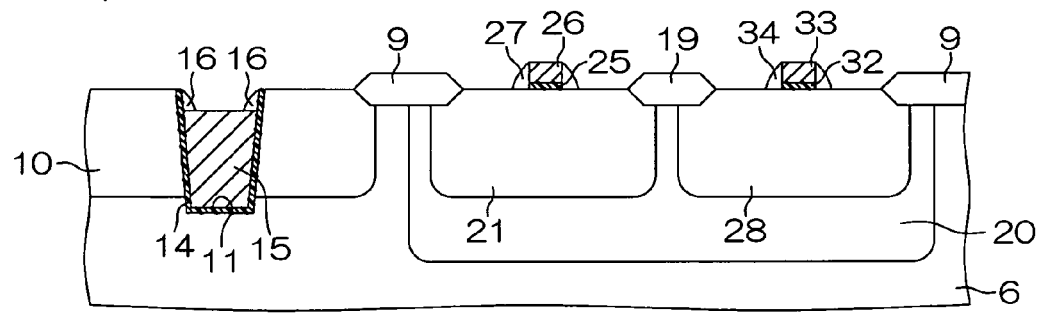

FIGS. 3A to 3R are schematic sectional views for illustrating another method of manufacturing the semiconductor device 1 shown in FIG. 1. Referring to FIGS. 3A to 3R, portions corresponding to those shown in FIGS. 2A to 2N are denoted by the same reference numerals as those in FIGS. 2A to 2N.

First, a hard mask 41 having an opening opposed to the VDMOS forming region 7 is formed on the epitaxial layer 6 by photolithography, as shown in FIG. 3A.

Thereafter the epitaxial layer 6 is etched through the hard mask 41, thereby forming a body region recess 42, as shown in FIG. 3B.

Then, a semiconductor layer 43 made of silicon doped with a P-type impurity is formed on the hard mask 41 and the body region recess 42 by epitaxy or CVD, as shown in FIG. 3C. The body region recess 42 is filled up with the semiconductor layer 43.

Thereafter the semiconductor layer 43 and the hard mask 41 are polished by CMP (Chemical Mechanical Polishing), until the surface of the epitaxial layer 6 is exposed. Thus, the portion of the semiconductor layer 43 located outside the body region recess 42 and the hard mask 41 are removed, and the body region 10 embedded in the body region recess 42 is obtained, as shown in FIG. 3D.

Then, an SiN film 44 having openings opposed to the portions for forming the LOCOS oxide films 9 and 19 is formed on the epitaxial layer 6 and the body region 10 by CVD, as shown in FIG. 3E.

Thereafter the LOCOS oxide films 9 and 19 are selectively formed on the surfaces of the epitaxial layer 6 and the body region 10 by LOCOS, as shown in FIG. 3F. The SiN film 44 is removed after the formation of the LOCOS oxide films 9 and 19.

Then, a resist film (not shown) having an opening opposed to the CMOS forming region 8 is formed on the epitaxial layer 6 by photolithography, as shown in FIG. 3G. Then, a P-type impurity (boron ions, for example) is implanted into the epitaxial layer 6 from the surface thereof through the resist film serving as a mask, thereby forming the deep well region 20. The resist film is removed after the implantation of the P-type impurity.

Then, a sacrificial oxide film 35 made of SiO$_2$ is formed on the surface of the epitaxial layer 6 by thermal oxidation, as shown in FIG. 3H. Thereafter an SiN layer 36 is formed on the sacrificial oxide film 35 by CVD.

Then, the sacrificial oxide film 35 and the SiN layer 36 are patterned by photolithography, to form a hard mask 37 having an opening opposed to the portion for forming the trench 11, as shown in FIG. 3I.

Thereafter the epitaxial layer 6 is etched through the hard mask 37, thereby forming the trench 11 as shown in FIG. 3J.

Then, thermal oxidation is performed while leaving the hard mask 37 on the epitaxial layer 6, thereby forming the gate insulating film 14 on the inner surface of the trench 11, as shown in FIG. 3K.

Then, a deposition layer 38 of polysilicon doped with an N-type impurity in a high concentration is formed on the gate insulating film 14 by CVD, as shown in FIG. 3L. The trench 11 is filled up with the deposition layer 38 of polysilicon.

Then, the portion of the deposition layer 38 of polysilicon located outside the trench 11 is removed by etch-back. This etch-back of the deposition layer 38 of polysilicon is continued until the surface of the deposition layer 38 of polysilicon embedded in the trench 11 becomes lower by 0.2 μm to 0.3 μm than the surface of the epitaxial layer 6. Consequently, the gate electrode 15 embedded in the trench 11 through the gate insulating film 14 is obtained, as shown in FIG. 3M.

Then, the hard mask 37 is removed, as shown in FIG. 3N. Thus, the surface of the epitaxial layer 6 is exposed.

Thereafter a resist film (not shown) having an opening opposed to the PMOS forming region 18 is formed on the epitaxial layer 6 by photolithography. Then, an N-type impurity (phosphorus ions, for example) is implanted into the epitaxial layer 6 from the surface thereof through the resist film serving as a mask, thereby forming the N-type well region 28, as shown in FIG. 3O. The resist film is removed after the implantation of the N-type impurity.

Another resist film (not shown) having an opening opposed to the NMOS forming region 17 is formed on the epitaxial layer 6 by photolithography. Then, a P-type impurity is implanted into the epitaxial layer 6 from the surface thereof through the resist film serving as a mask, thereby forming the P-type well region 21, as shown in FIG. 3O. The resist film is removed after the implantation of the P-type impurity.

Thereafter an SiO$_2$ film (not shown) is formed on the surface of the epitaxial layer 6 by thermal oxidation. Then, a polysilicon film (not shown) is formed on the SiO$_2$ film by thermal CVD. Thereafter the SiO$_2$ film and the polysilicon film are selectively removed by photolithography and etching. Thus, the gate insulating films 25 and 32 and the gate electrodes 26 and 33 are formed as shown in FIG. 3P.

Then, an SiN film (or an SiO$_2$ film) 39 is formed on the gate electrodes 15, 26 and 33, the LOCOS oxide films 9 and 19 and the epitaxial layer 6 by CVD, as shown in FIG. 3Q.

Thereafter the SiN film 39 is etched back. Thus, the SiN film 39 remains on the peripheries of the gate electrodes 26 and 33 to form the sidewalls 27 and 34 consisting of the residual portions of the SiN film 39, as shown in FIG. 3R. The SiN film 39 also remains on the peripheral edge portion of the surface of the gate electrode 15, to form the peripheral wall film 16 consisting of the residual portion of the SiN film 39.

Thereafter an N-type impurity is implanted in a high concentration into the portions for forming the source regions 12 and 23 and the drain region 24. Further, a P-type impurity is implanted in a high concentration into the portions for forming the body contact region 13, the source region 30 and the drain region 31. Thus, the source regions 12, 23 and 30, the drain regions 24 and 31 and the body contact region 13 are formed, and the semiconductor device 1 having the structure shown in FIG. 1 is obtained.

Also according to this method, effects similar to those of the method shown in FIGS. 2A to 2N can be attained.

In addition to the aforementioned treatments, annealing for activating ions etc. is properly performed if necessary.

Further, the semiconductor layer 43 is embedded in the body region recess 42 by epitaxy or CVD. Therefore, the body region 10 consisting of the semiconductor layer 43 embedded in the body region recess 42 has a generally uniform impurity concentration in the depth direction (thickness direction). Thus, the bottom portion of the body region 10 has an impurity concentration generally identical to that of the surface layer portion. Therefore, the impurity concentration of the bottom portion can be increased without increasing the peak concentration (peak value of the impurity concentration) of the body region 10 as compared with a case of forming the body region 10 by implantation and diffusion of an impurity. Consequently, spreading of a depletion layer from the interface between the epitaxial layer 6 and the body region 10 toward the body region 10 can be suppressed, whereby the width (depth) of the depletion layer formed in the body region 10 can be reduced.

The width of the depletion layer formed in the body region 10 can be so reduced that the depth of the body region 10 can be reduced. Thus, the depth of the trench 11 formed to penetrate the body region 10 can be reduced, whereby portions around the upper and lower ends of the trench 11 can be prevented from action of remarkable stress, and occurrence of crystal defects resulting from stress can be prevented. Further, the channel length (gate length) can be so reduced that the on-resistance of the VDMOSFET 3 can be reduced.

Figure 4A:
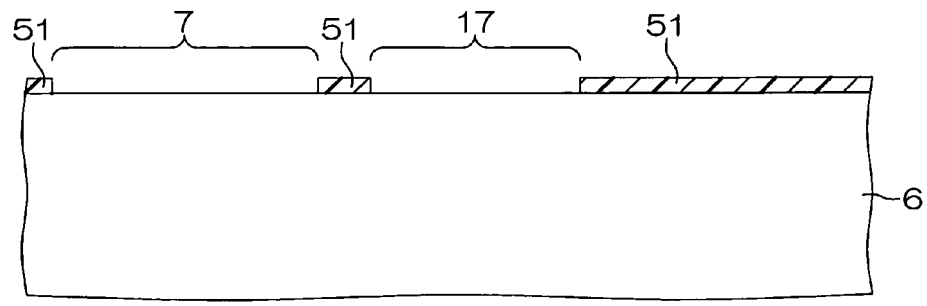
FIG. 4A is a schematic sectional view for illustrating still another method of manufacturing the semiconductor device shown in FIG. 1.

FIGS. 4A to 4O are schematic sectional views for illustrating still another method of manufacturing the semiconductor device 1 shown in FIG. 1. Referring to FIGS. 4A to 4O, portions corresponding to those shown in FIGS. 2A to 2J are denoted by the same reference numerals as those in FIGS. 2A to 2J.

First, a hard mask 51 having openings opposed to the VDMOS forming region 7 and the NMOS forming region 17 is formed on the epitaxial layer 6 by photolithography, as shown in FIG. 4A.

Figure 4B:
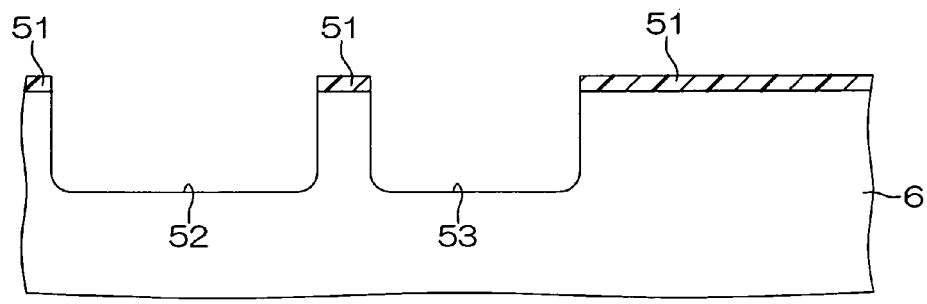
FIGS. 4B to 4O are schematic sectional views successively showing the steps subsequent to the step shown in FIG. 4A.

Thereafter the epitaxial layer 6 is etched through the hard mask 51, thereby forming a body region recess 52 and a P-type well recess 53, as shown in FIG. 4B.

Figure 4C:
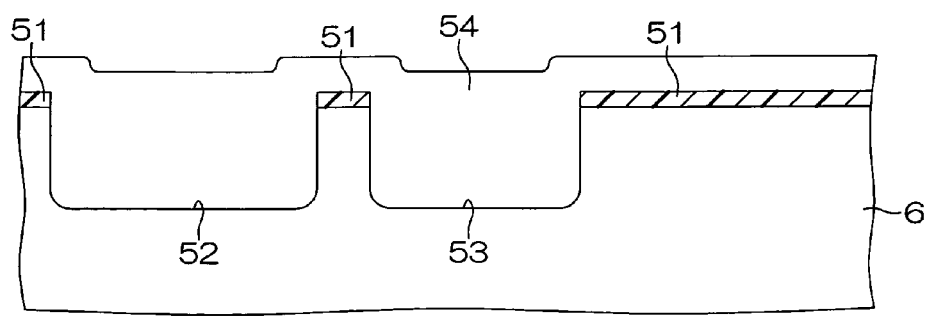

Then, a semiconductor layer 54 made of silicon doped with a P-type impurity is formed on the hard mask 51, the body region recess 52 and the P-type well recess 53 by epitaxy, as shown in FIG. 4C. The body region recess 52 and the P-type well recess 53 are filled up with the semiconductor layer 54.

Figure 4D:
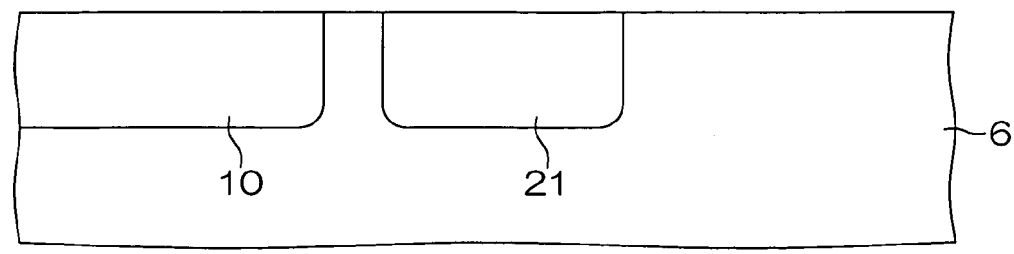

Thereafter the semiconductor layer 54 and the hard mask 51 are polished by CMP until the surface of the epitaxial layer 6 is exposed. Thus, the portions of the semiconductor layer 54 located outside the body region recess 52 and the P-type well recess 53 and the hard mask 51 are removed, and the body region 10 embedded in the body region recess 52 and the P-type wellregion 21 embeddedin the P-type well recess 53 are obtained, as shown in FIG. 4D.

Figure 4E:
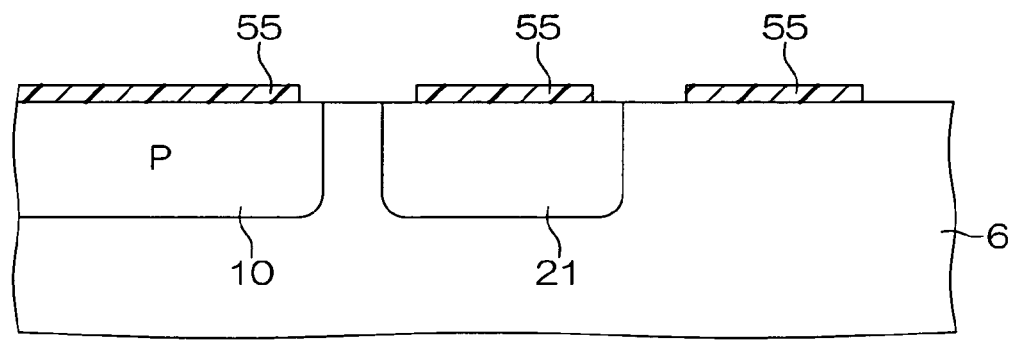

Then, an SiN film 55 having openings opposed to the portions for forming the LOCOS oxide films 9 and 19 is formed on the epitaxial layer 6 and the body region 10 by CVD, as shown in FIG. 4E.

Figure 4F:
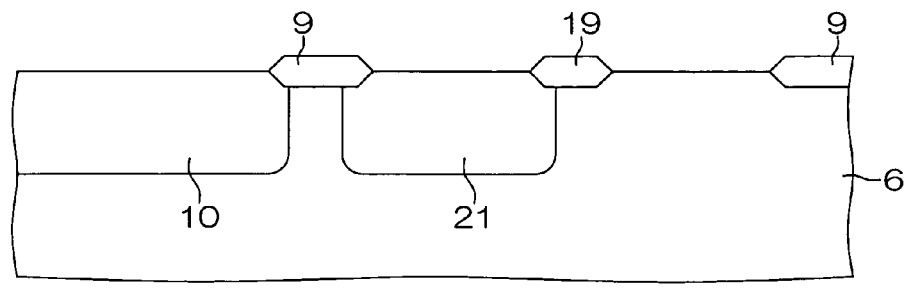

Thereafter the LOCOS oxide films 9 and 19 are selectively formed on the surfaces of the epitaxial layer 6 and the body region 10 by LOCOS, as shown in FIG. 4F. The SiN film 55 is removed after the formation of the LOCOS oxide films 9 and 19.

Figure 4G:
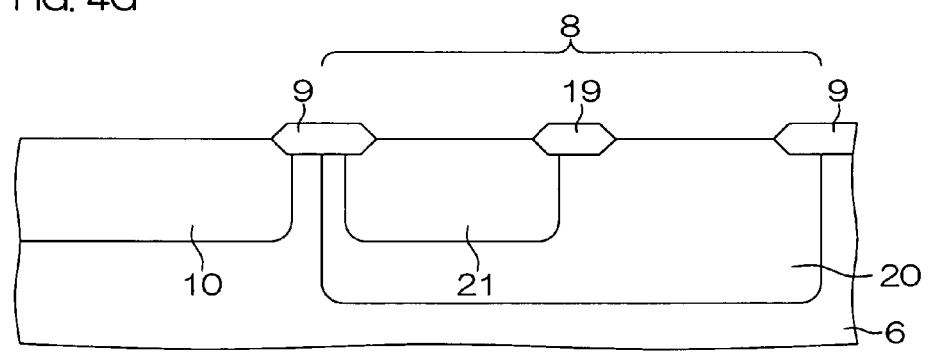

Then, a resist film (not shown) having an opening opposed to the CMOS forming region 8 is formed on the epitaxial layer 6 by photolithography, as shown in FIG. 4G. Then, a P-type impurity (boron ions, for example) is implanted into the epitaxial layer 6 from the surface thereof through the resist film serving as a mask, thereby forming the deep well region 20. The resist film is removed after the implantation of the P-type impurity.

Figure 4H:
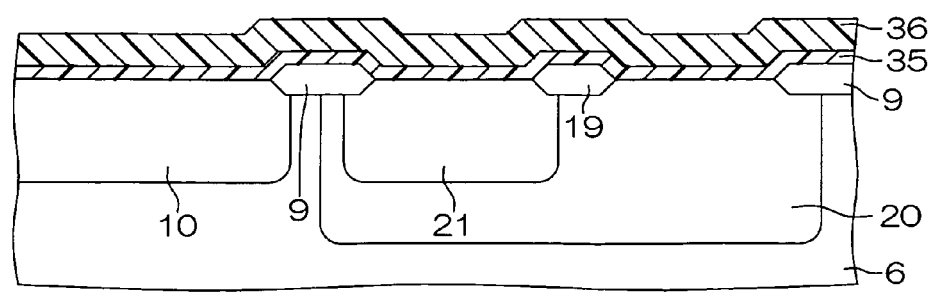

Then, a sacrificial oxide film 35 made of $SiO_2$ is formed on the surface of the epitaxial layer 6 by thermal oxidation, as shown in FIG. 4H. Thereafter an SiN layer 36 is formed on the sacrificial oxide film 35 by CVD.

Figure 4I:
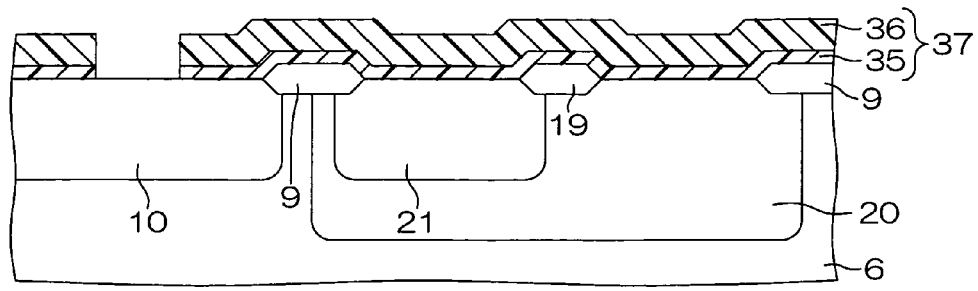

Then, the sacrificial oxide film 35 and the SiN layer 36 are patterned by photolithography, to form a hard mask 37 having an opening opposed to the portion for forming the trench 11, as shown in FIG. 4I.

Figure 4J:
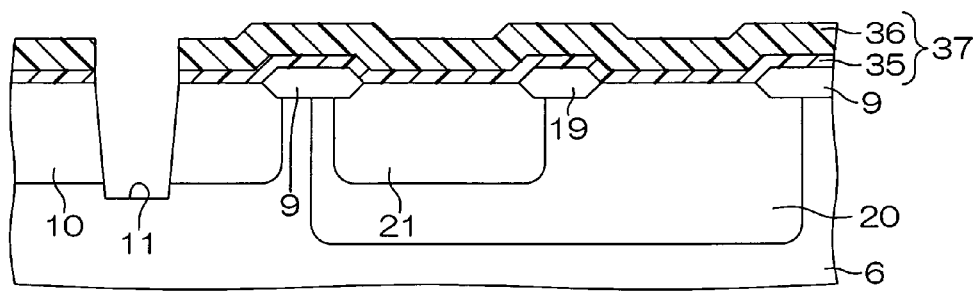

Thereafter the epitaxial layer 6 is etched through the hard mask 37, thereby forming the trench 11 as shown in FIG. 4J.

Figure 4K:
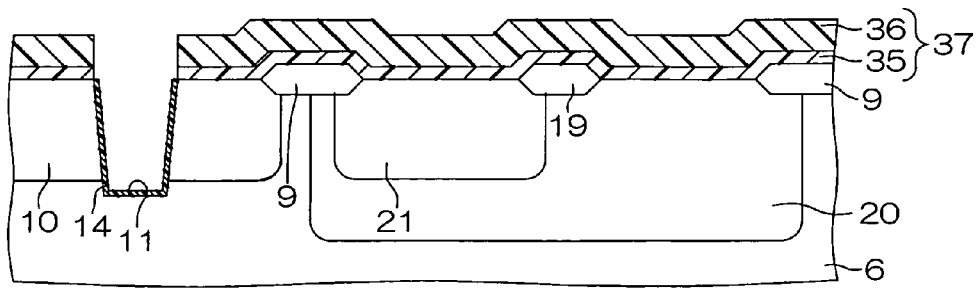

Then, thermal oxidation is performed while leaving the hard mask 37 on the epitaxial layer 6, thereby forming the gate insulating film 14 on the inner surface of the trench 11, as shown in FIG. 4K.

Figure 4L:
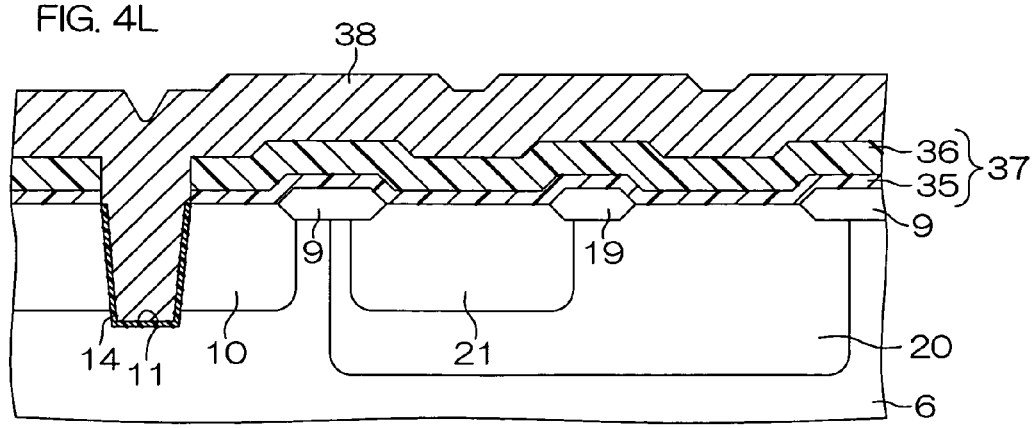

Then, a deposition layer 38 of polysilicon doped with an N-type impurity in a high concentration is formed on the gate insulating film 14 by CVD, as shown in FIG. 4L. The trench 11 is filled up with the deposition layer 38 of polysilicon.

Figure 4M:
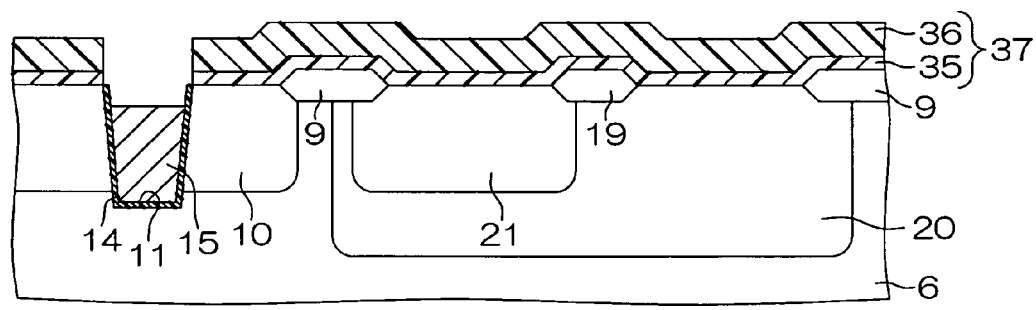

Then, the portion of the deposition layer 38 of polysilicon located outside the trench 11 is removed by etch-back. This etch-back of the deposition layer 38 of polysilicon is continued until the surface of the deposition layer 38 of polysilicon embedded in the trench 11 becomes lower by 0.2 μm to 0.3 μm than the surface of the epitaxial layer 6. Consequently, the gate electrode 15 embedded in the trench 11 through the gate insulating film 14 is obtained, as shown in FIG. 4M.

Figure 4N:
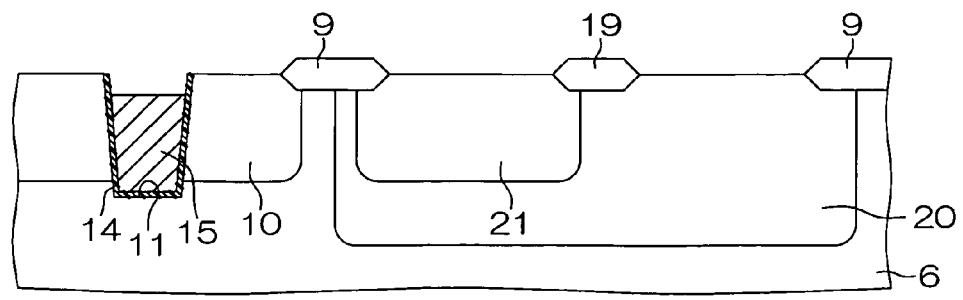
Figure 40:
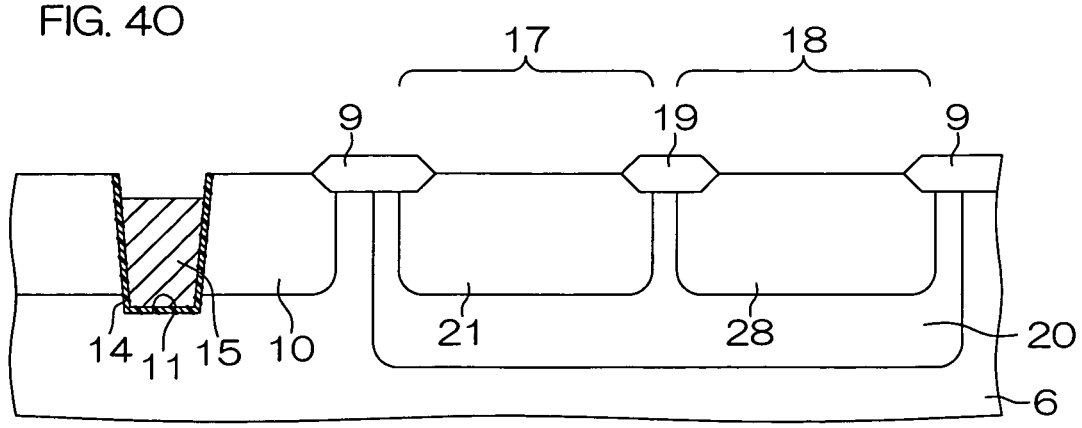

Then, the hard mask 37 is removed, as shown in FIG. 4N. Thus, the surface of the epitaxial layer 6 is exposed.

Thereafter a resist film (not shown) having an opening opposed to the PMOS forming region 18 is formed on the epitaxial layer 6 by photolithography. Then, an N-type impurity (phosphorus ions, for example) is implanted into the epitaxial layer 6 from the surface thereof through the resist film serving as a mask, thereby forming the N-type well region 28, as shown in FIG. 4O. The resist film is removed after the implantation of the N-type impurity.

After the step shown in FIG. 4O, the steps shown in FIGS. 3P to 3R are so carried out as to form the source regions 12, 23 and 30, the drain regions 24 and 31 and the body contact region 13, whereby the semiconductor device 1 having the structure shown in FIG. 1 is obtained.

Also according to this method, effects similar to those of the method shown in FIGS. 3A to 3R can be attained. Further, the P-type well region 21 of the NMOSFET 4 can be formed in the same step as the body region 10 of the VDMOSFET 3.

In addition to the aforementioned treatments, annealing for activating ions etc. is properly performed if necessary.

Figure 5:
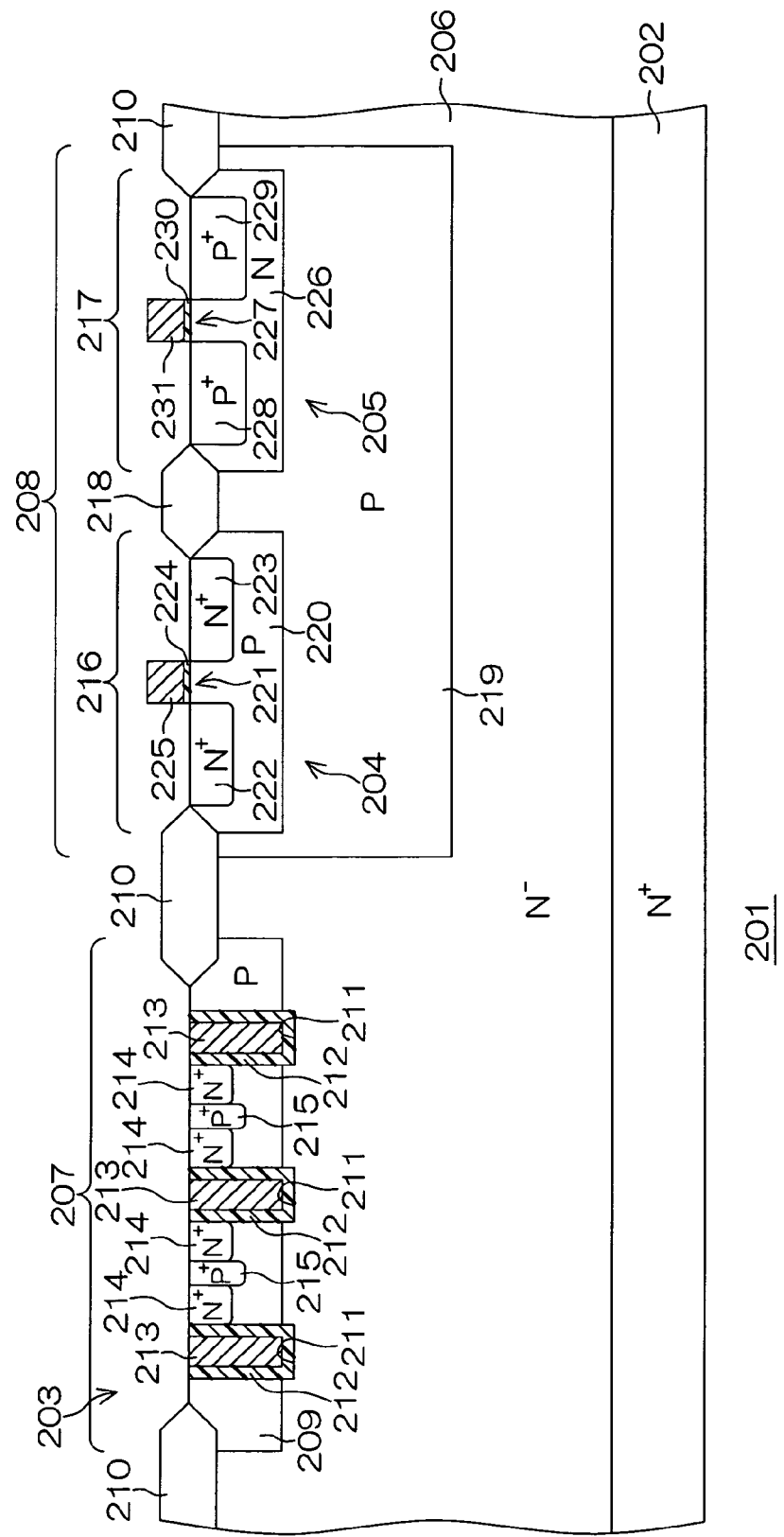
FIG. 5 is a schematic sectional view showing the structure of a semiconductor device according to a second embodiment of the present invention.

FIG. 5 is a schematic sectional view showing the structure of a semiconductor device 201 according to a second embodiment of the present invention.

The semiconductor device 201 includes a trench gate VDMOSFET 203 (hereinafter referred to as "VDMOSFET 203"), a planar gate N-channel MOSFET 204 (hereinafter referred to as "NMOSFET 204") and a planar gate P-channel MOSFET 205 (hereinafter referred to as "PMOSFET 205") on an N+-type (high-concentration N-type) substrate 202 made of silicon.

An N−-type epitaxial layer 206 made of silicon is formed on the semiconductor substrate 202. A LOCOS oxide film 210 for isolating a VDMOS forming region 207 and a CMOS forming region 208 from each other is formed on the surface of the epitaxial layer 206.

The VDMOSFET 203 is formed in the VDMOS forming region 207. In the VDMOS forming region 207, a P-type body region 209 is formed in a surface layer portion of the epitaxial layer 206. In the VDMOS forming region 207, further, trenches 211 are dug in the epitaxial layer 206 from the surface thereof. The trenches 211 penetrate the body region 209, so that the deepest portions thereof reach the epitaxial layer 206 under the body region 209. The plurality of trenches 211 are formed at regular intervals in the horizontal direction in FIG. 5, to extend in a direction (along the gate width) orthogonal to the plane of FIG. 5 respectively. Gate insulating films 212 are formed in the trenches 211, to cover the overall inner surfaces thereof. Gate electrodes 213 are embedded in the trenches 211 by filling up the gate insulating films 212 with polysilicon doped with an N-type impurity in a high concentration.

In a surface layer portion of the body region 209, an N+-type source region 214 is formed on at least one side of each trench 211 in a direction (horizontal direction in FIG. 5) orthogonal to the gate width. The source region 214 extends along the trench 211 in the direction along the gate width. A P+-type body contact region 215 is formed at the center of the source region 214 in the direction orthogonal to the gate width, to penetrate the source region 214.

The NMOSFET 204 and the PMOSFET 205 are formed in the CMOS forming region 208. More specifically, a LOCOS oxide film 218 for isolating an NMOS forming region 216 and a PMOS forming region 217 from each other is formed on the surface of the epitaxial layer 206 in the CMOS forming region 208, and the NMOSFET 204 and the PMOSFET 205 are formed in the NMOS forming region 216 and the PMOS forming region 217 respectively.

In the CMOS forming region 208, a P-type deep well region 219 is formed in the surface layer portion of the epitaxial layer 206. The deep well region 219 has a larger depth than the body region 209.

In the NMOS forming region 216, a P-type well region 220 is formed in a surface layer portion of the deep well region 219. N+-type source and drain regions 222 and 223 are formed in a surface layer portion of the P-type well region 220 through a channel region 221.

A gate insulating film 224 made of $SiO_2$ is formed on the channel region 221. A gate electrode 225 made of polysilicon doped with an N-type impurity in a high concentration is formed on the gate insulating film 224.

In the PMOS forming region 217, an N-type well region 226 is formed in the surface layer portion of the deep well region 219. P+-type source and drain regions 228 and 229 are formed in a surface layer portion of the N-type well region 226 through a channel region 227.

A gate insulating film 230 made of $SiO_2$ is formed on the channel region 227. A gate electrode 231 made of polysilicon doped with an N-type impurity in a high concentration is formed on the gate insulating film 230.

FIGS. 6A to 6M are schematic sectional views for illustrating a method of manufacturing the semiconductor device 201 shown in FIG. 5.

Figure 6A:
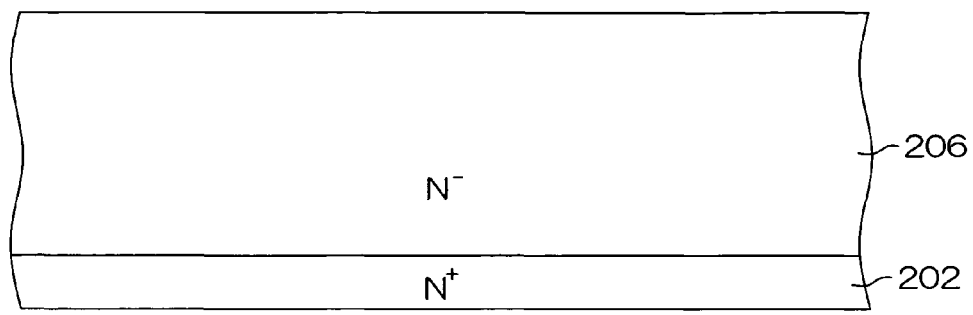
FIG. 6A is a schematic sectional view for illustrating a method of manufacturing the semiconductor device shown in FIG. 5.

First, the epitaxial layer 206 is formed on the semiconductor substrate 202 by epitaxy, as shown in FIG. 6A.

Figure 6B:
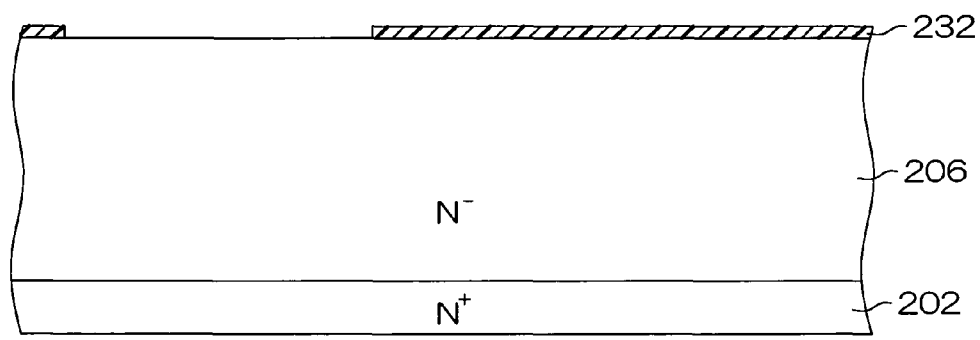
FIGS. 6B to 6M are schematic sectional views successively showing the steps subsequent to the step shown in FIG. 6A.

Then, a hard mask 232 having an opening opposed to the VDMOS forming region 207 is formed on the epitaxial layer 206 by photolithography, as shown in FIG. 6B.

Figure 6C:
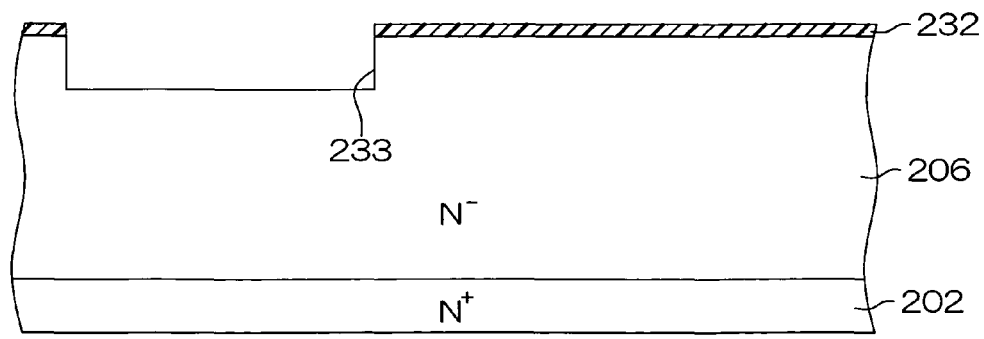

Thereafter the epitaxial layer 206 is etched through the hard mask 232, thereby forming a body region recess 233, as shown in FIG. 6C.

Figure 6D:
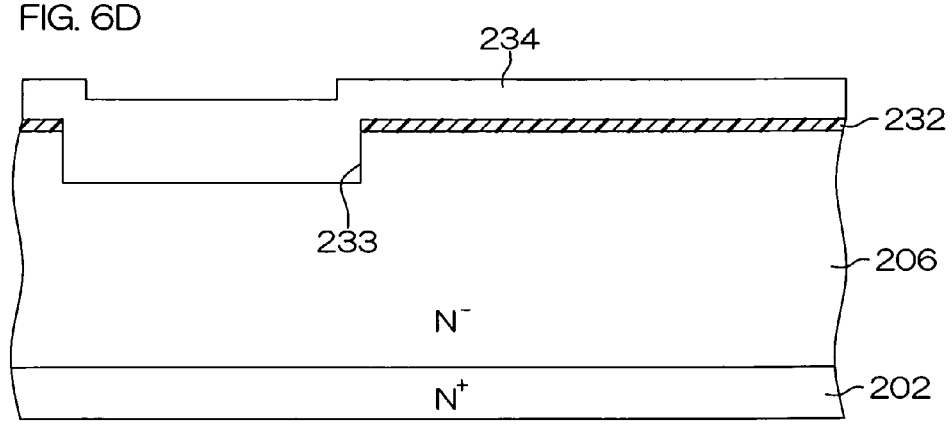

Then, a semiconductor layer 234 made of silicondoped with a P-type impurity is formed on the body region recess 233 and the hard mask 232 by epitaxy, as shown in FIG. 6D. The body region recess 233 is filled up with the semiconductor layer 234.

Figure 6E:
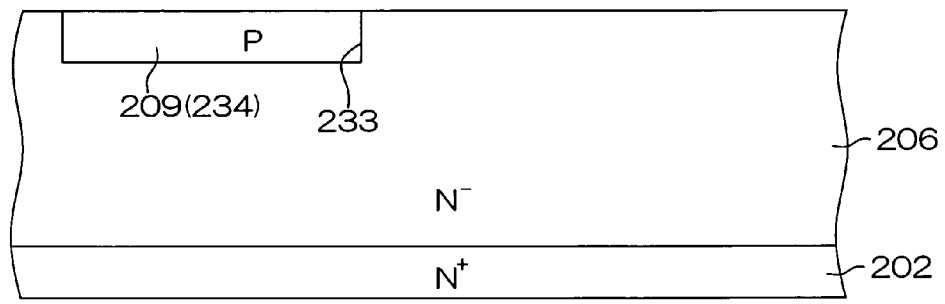

Thereafter the semiconductor layer 234 and the hard mask 232 are polished by CMP (Chemical Mechanical Polishing), until the surface of the epitaxial layer 206 is exposed. Thus, the portion of the semiconductor layer 234 located outside the body region recess 233 and the hard mask 232 are removed, and the body region 209 consisting of the semiconductor layer 234 embedded in the body region recess 233 is obtained, as shown in FIG. 6E.

Figure 6F:
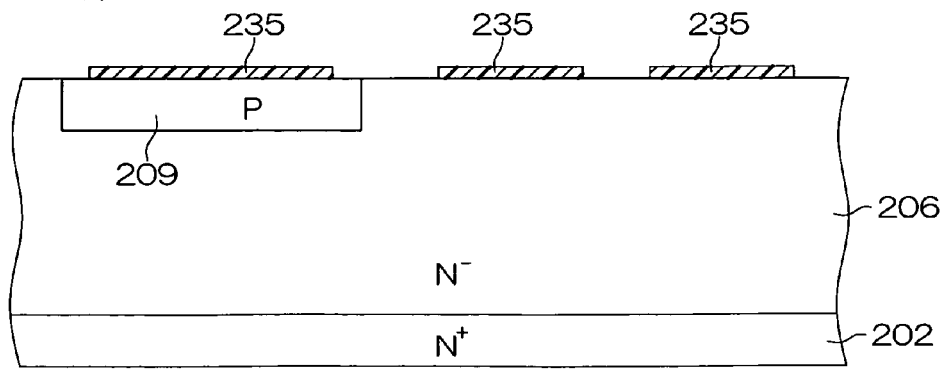

Then, an SiN film 235 having openings opposed to the portions for forming the LOCOS oxide films 210 and 218 is formed on the epitaxial layer 206 and the body region 209 by CVD (Chemical Vapor Deposition), as shown in FIG. 6F.

Figure 6G:
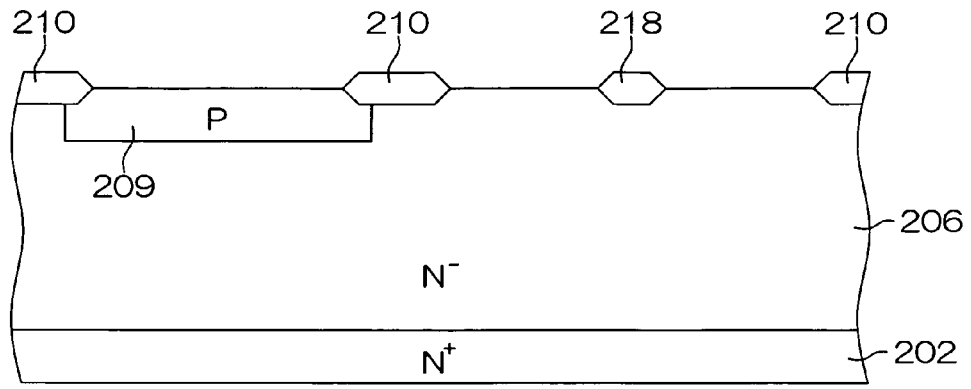

Thereafter the LOCOS oxide films 210 and 218 are selectively formed on the surfaces of the epitaxial layer 206 and the body region 209 by LOCOS, as shown in FIG. 6G. The SiN film 235 is removed after the formation of the LOCOS oxide films 210 and 218.

Figure 6H:
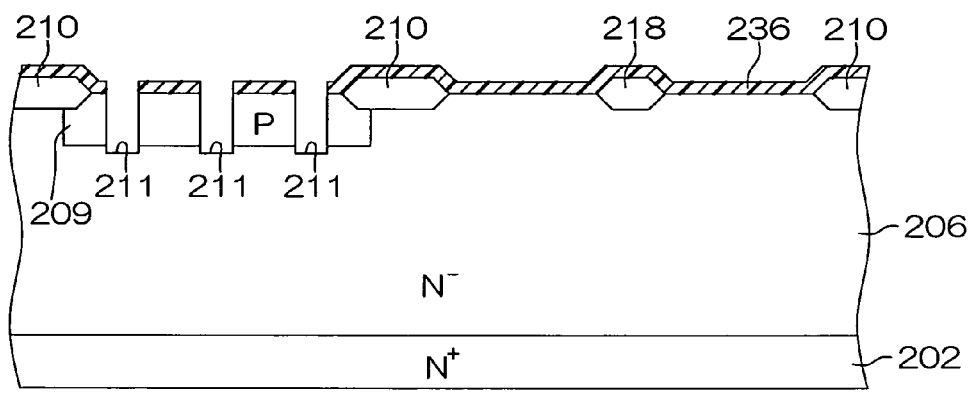

Then, an SiN layer is formed on the surfaces of the epitaxial layer 206 and the body region 209 by CVD. This SiN layer is patterned by photolithography, to form a hard mask 236 having an opening opposed to the portion for forming each trench 211, as shown in FIG. 6H. Thereafter the epitaxial layer 206 is etched through the hard mask 236, thereby etching each trench 211.

Figure 6I:
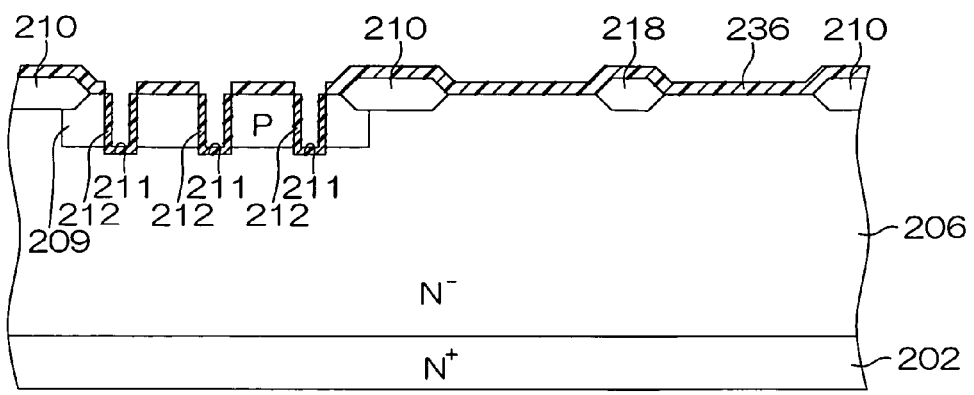

Then, thermal oxidation is performed while leaving the hard mask 236 on the epitaxial layer 206, thereby forming the gate insulating film 212 on the inner surface of the trench 211, as shown in FIG. 6I.

Figure 6J:
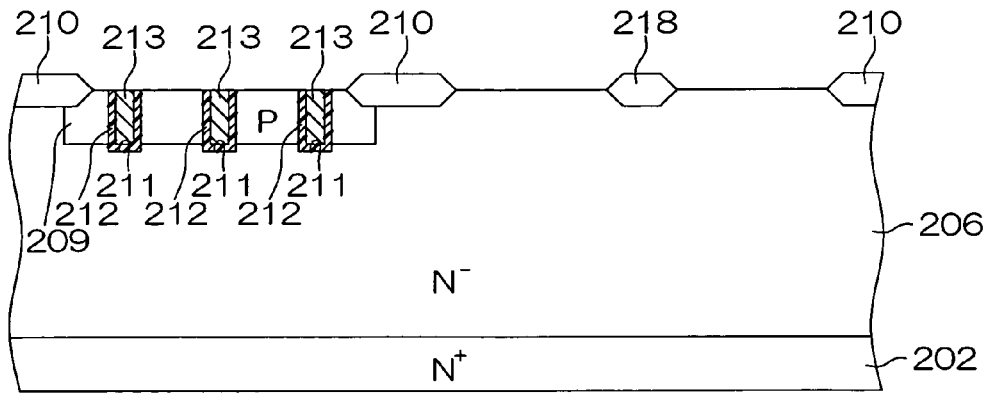

Then, a deposition layer (not shown) of polysilicon doped with an N-type impurity in a high concentration is formed on the gate insulating film 212 by CVD. The trench 211 is filled up with the deposition layer of polysilicon. Then, the portion of the deposition layer of polysilicon located outside the trench 211 is removed by etch-back. Thus, the gate electrode 213 embedded in the trench 211 through the gate insulating film 212 is obtained, as shown in FIG. 6J. The hard mask 236 is removed after the formation of the gate electrode 213. Thus, the surface of the epitaxial layer 206 is exposed.

Figure 6K:
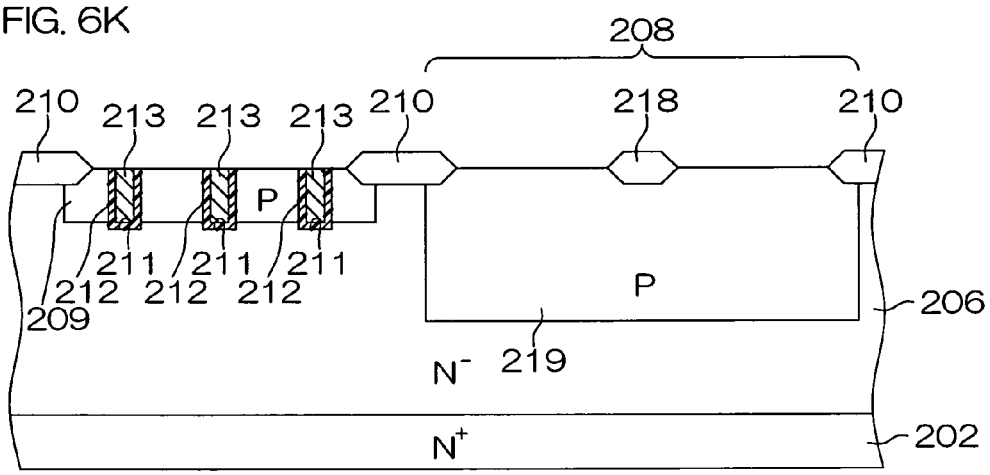

Thereafter a resist film (not shown) having an opening opposed to the CMOS forming region 208 is formed on the epitaxial layer 206 by photolithography, as shown in FIG. 6K. Then, a P-type impurity is implanted into the epitaxial layer 206 from the surface thereof through the resist film serving as a mask, thereby forming the deep well region 219. The resist film is removed after the implantation of the P-type impurity.

Figure 6L:
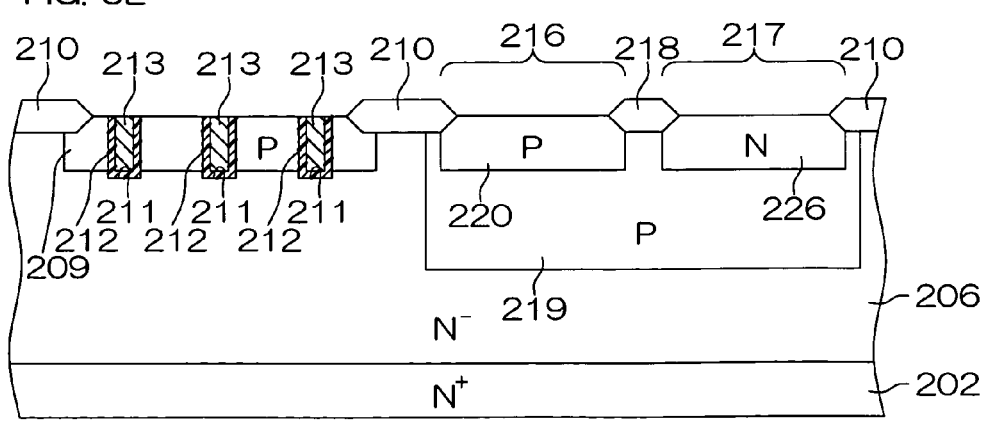

Then, another resist film (not shown) having an opening opposed to the PMOS forming region 217 is formed on the epitaxial layer 206 by photolithography, as shown in FIG. 6L. Then, an N-type impurity is implanted into the epitaxial layer 206 from the surface thereof through the resist film serving as a mask, thereby forming the N-type well region 226. The resist film is removed after the implantation of the N-type impurity. Then, still another resist film (not shown) having an opening opposed to the NMOS forming region 216 is formed on the epitaxial layer 206 by photolithography. Then, a P-type impurity is implanted into the epitaxial layer 206 from the surface thereof through the resist film serving as a mask, thereby forming the P-type well region 220. The resist film is removed after the implantation of the P-type impurity.

Figure 6M:
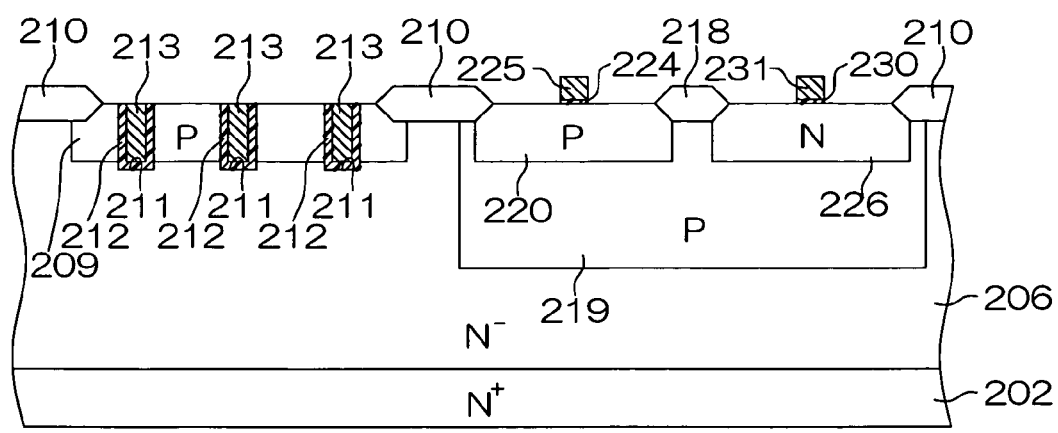

Thereafter an $SiO_2$ film (not shown) is formed on the surface of the epitaxial layer 206 by thermal oxidation. Then, a polysilicon film (not shown) is formed on the $SiO_2$ film by thermal CVD. Thereafter the $SiO_2$ film and the polysilicon film are selectively removed by photolithography and etching. Thus, the gate insulating films 224 and 230 and the gate electrodes 225 and 231 are formed as shown in FIG. 6M.

Thereafter an N-type impurity is implanted in a high concentration into the portions for forming the source regions 214 and 222 and the drain region 223. Further, a P-type impurity is implanted in a high concentration into the portions for forming the body contact region 215, the source region 228 and the drain region 229. Thus, the source regions 214, 222 and 228, the drain regions 223 and 229 and the body contact region 215 are formed.

The semiconductor device 201 having the structure shown in FIG. 5 is obtained through the aforementioned steps.

According to this method, the semiconductor layer 234 formed by epitaxy has a generally uniform impurity concentration in the depth direction (thickness direction) thereof. Thus, the bottom portion of the body region 209 consisting of the semiconductor layer 234 has an impurity concentration generally identical to that of the surface layer portion. Therefore, the impurity concentration of the bottom portion can be increased without increasing the peak concentration (peak value of the impurity concentration) of the body region 209 as compared with a case of forming the body region 209 by implantation and diffusion of an impurity. Consequently, spreading of a depletion layer from the interface between the $N^-$-type epitaxial layer 206 and the P-type body region 209 toward the body region 209 can be suppressed, whereby the width (depth) of the depletion layer formed in the body region 209 can be reduced.

The width of the depletion layer formed in the body region 209 can be so reduced that the depth of the body region 209 can be reduced. Thus, the depth of the trench 211 formed to penetrate the body region 209 can be reduced, whereby portions around the upper and lower ends of the trench 211 can be prevented from action of remarkable stress, and occurrence of crystal defects resulting from stress can be prevented. Further, the channel length (gate length) can be so reduced that the on-resistance of the VDMOSFET 203 can be reduced.

FIGS. 7A to 7M are schematic sectional views for illustrating another method of manufacturing the semiconductor device 201 shown in FIG. 5.

Figure 7A:
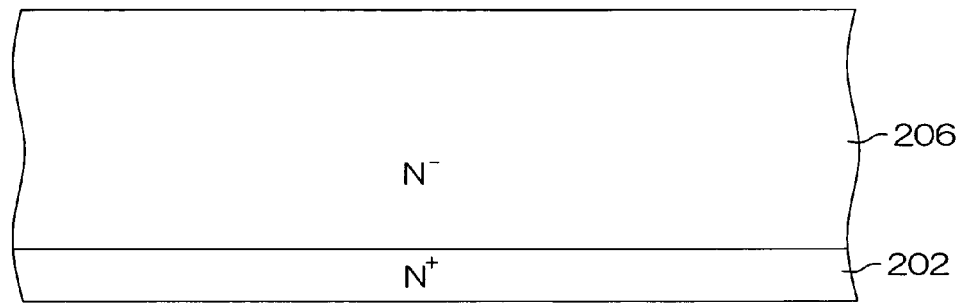
FIG. 7A is a schematic sectional view for illustrating another method of manufacturing the semiconductor device shown in FIG. 5.

First, the epitaxial layer 206 is formed on the semiconductor substrate 202 by epitaxy, as shown in FIG. 7A.

Figure 7B:
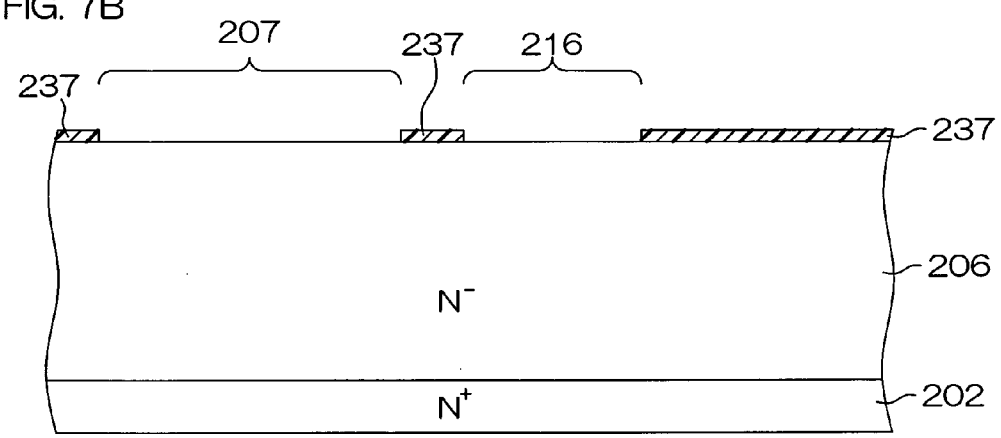
FIGS. 7B to 7M are schematic sectional views successively showing the steps subsequent to the step shown in FIG. 7A.

Then, a hard mask 237 having openings opposed to the VDMOS forming region 207 and the NMOS forming region 216 is formed on the epitaxial layer 206 by photolithography, as shown in FIG. 7B.

Figure 7C:
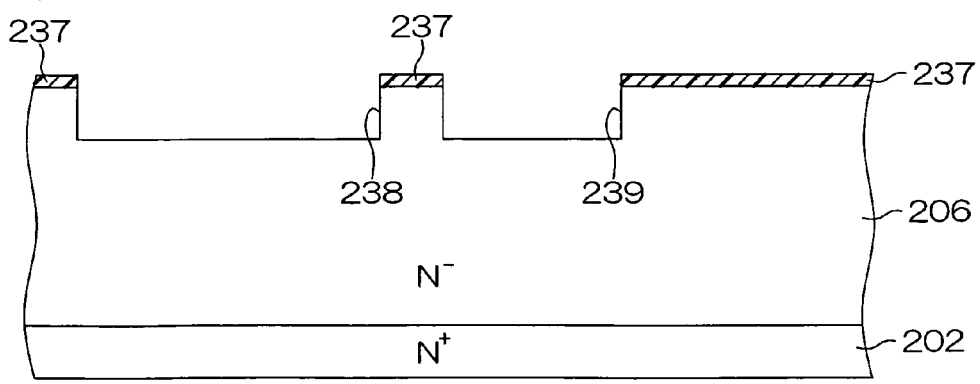

Thereafter the epitaxial layer 206 is etched through the hard mask 237, thereby forming a body region recess portion 238 and a P-type well recess 239, as shown in FIG. 7C.

Figure 7D:
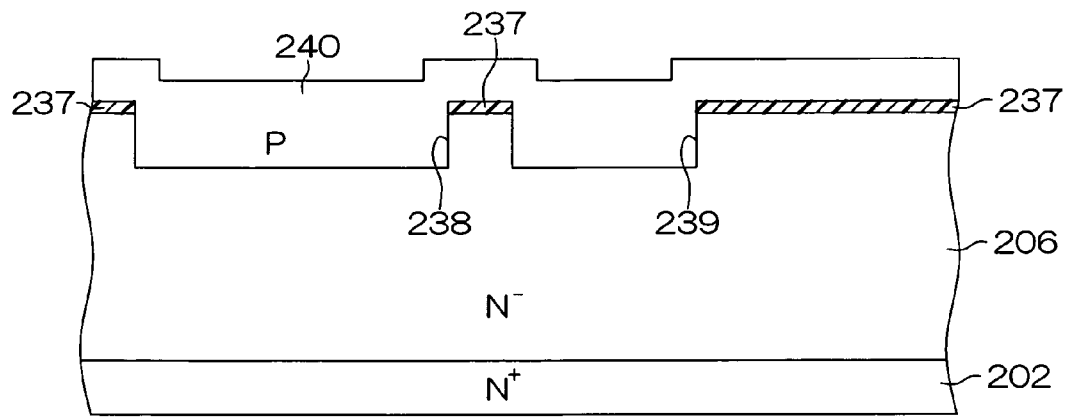

Then, a semiconductor layer 240 made of silicon doped with a P-type impurity is formed on the body region recess 238, the P-type well recess 239 and the hard mask 237 by epitaxy, as shown in FIG. 7D.

Figure 7E:
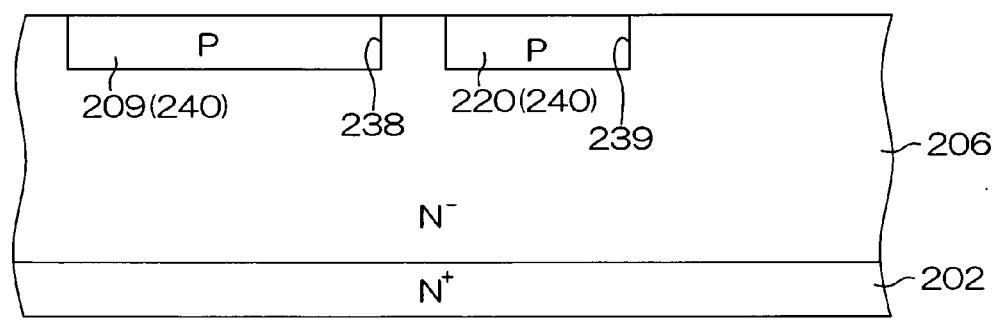

Thereafter the semiconductor layer 240 and the hard mask 237 are polished by CMP until the surface of the epitaxial layer 206 is exposed. Thus, the portions of the semiconductor layer 240 located outside the body region recess 238 and the P-type well recess 239 and the hard mask 237 are removed, and the body region 209 embedded in the body region recess 238 and the P-type well region 220 embedded in the P-type well recess 239 are obtained, as shown in FIG. 7E.

Figure 7F:
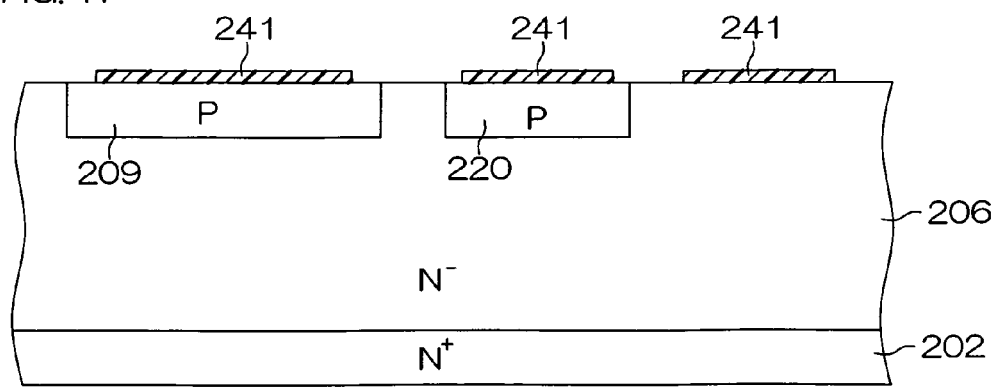

Then, an SiN film 241 having openings opposed to the portions for forming the LOCOS oxide films 210 and 218 is formed on the epitaxial layer 206, the body region 209 and the P-type well region 220 by CVD (Chemical Vapor Deposition), as shown in FIG. 7F.

Figure 7G:
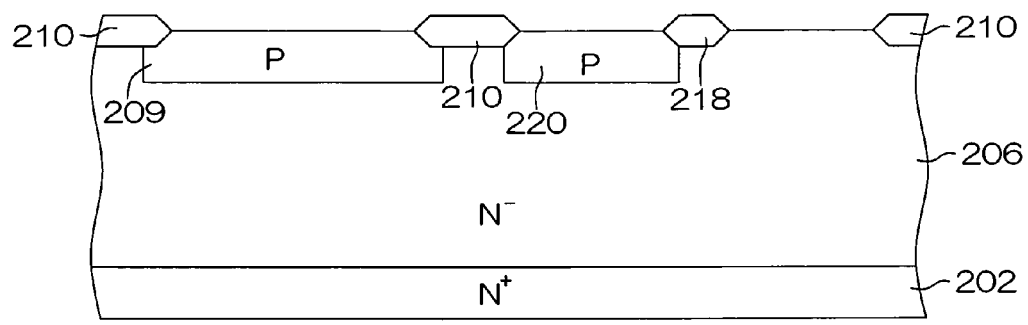

Thereafter the LOCOS oxide films 210 and 218 are selectively formed on the surfaces of the epitaxial layer 206, the body region 209 and the P-type well region 220 by LOCOS, as shown in FIG. 7G. The SiN film 241 is removed after the formation of the LOCOS oxide films 210 and 218.

Figure 7H:
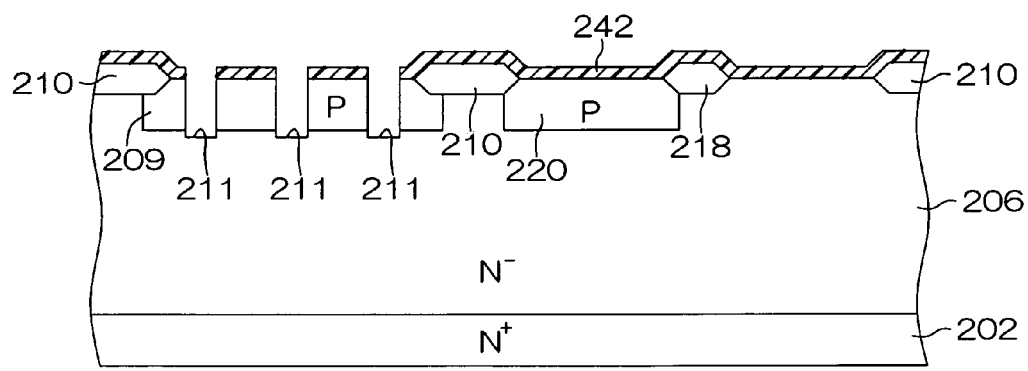

Then, an SiN layer is formed on the surfaces of the epitaxial layer 206 and the body region 209 by CVD. This SiN layer is patterned by photolithography, thereby forming a hard mask 242 having an opening opposed to the portion for forming each trench 211, as shown in FIG. 7H. Thereafter the epitaxial layer 206 is etched through the hard mask 242, thereby forming each trench 211.

Figure 7I:
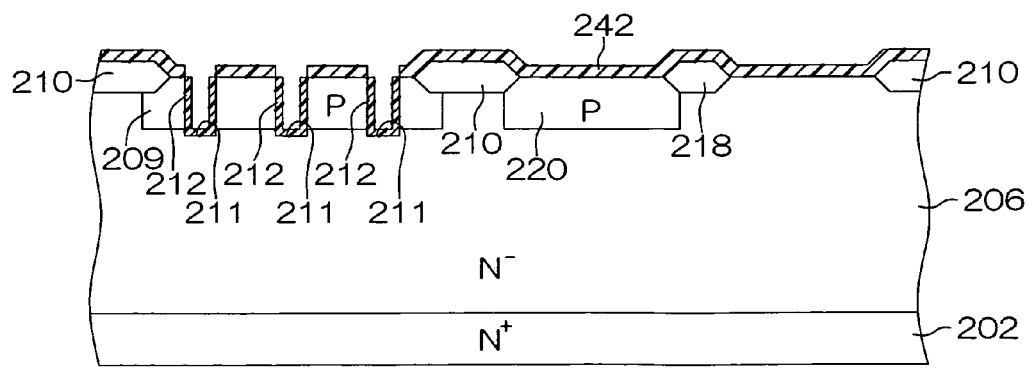

Then, thermal oxidation is performed while leaving the hard mask 242 on the epitaxial layer 206, thereby forming the gate insulating film 212 on the inner surface of the trench 211, as shown in FIG. 7I.

Figure 7J:
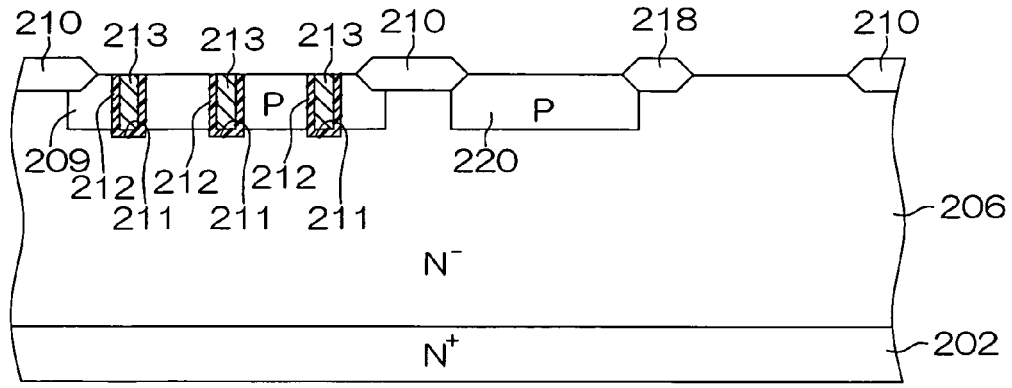

Then, a deposition layer (not shown) of polysilicon doped with an N-type impurity in a high concentration is formed on the gate insulating film 212 by CVD. The trench 211 is filled up with the deposition layer of polysilicon. Then, the portion of the deposition layer of polysilicon located outside the trench 211 is removed by etch-back. Thus, the gate electrode 213 embedded in the trench 211 through the gate insulating film 212 is obtained, as shown in FIG. 7J. The hard mask 242 is removed after the formation of the gate electrode 213. Thus, the surface of the epitaxial layer 206 is exposed.

Figure 7K:
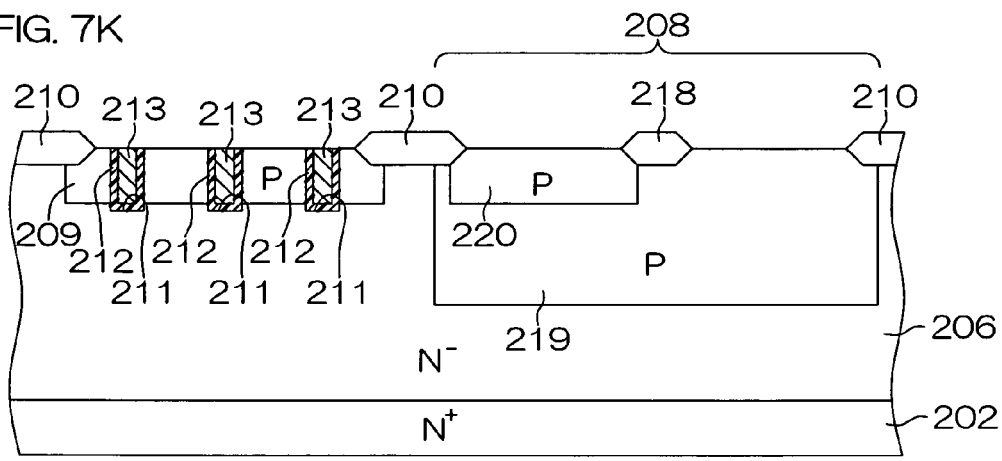

Thereafter a resist film (not shown) having an opening opposed to the CMOS forming region 208 is formed on the epitaxial layer 206 by photolithography, as shown in FIG. 7K. Then, a P-type impurity is implanted into the epitaxial layer 206 from the surface thereof through the resist film serving as a mask, thereby forming the deep well region 219. The resist film is removed after the implantation of the P-type impurity.

Figure 7L:
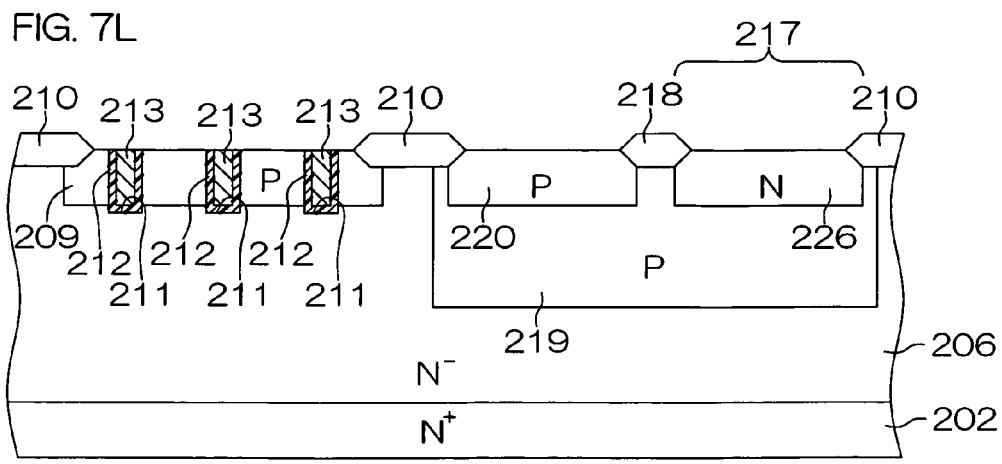

Then, another resist film (not shown) having an opening opposed to the PMOS forming region 217 is formed on the epitaxial layer 206 by photolithography, as shown in FIG. 7L. Then, an N-type impurity is implanted into the epitaxial layer 206 from the surface thereof through the resist film serving as a mask, thereby forming the N-type well region 226. The resist film is removed after the implantation of the N-type impurity.

Figure 7M:
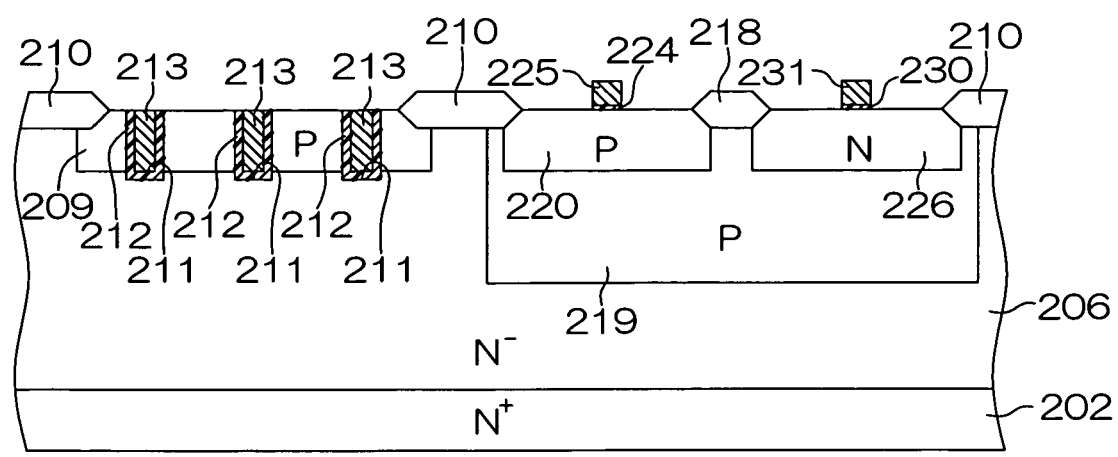

Thereafter an $SiO_2$ film (not shown) is formed on the surface of the epitaxial layer 206 by thermal oxidation. Then, a polysilicon film (not shown) is formed on the $SiO_2$ film by thermal CVD. Thereafter the $SiO_2$ film and the polysilicon film are selectively removed by photolithography and etching. Thus, the gate insulating films 224 and 230 and the gate electrodes 225 and 231 are formed as shown in FIG. 7M.

Thereafter an N-type impurity is implanted in a high concentration into the portions for forming the source regions 214 and 222 and the drain region 223. Further, a P-type impurity is implanted in a high concentration into the portions for forming the body contact region 215, the source region 228 and the drain region 229. Thus, the source regions 214, 222 and 228, the drain regions 223 and 229 and the body contact region 215 are formed.

The semiconductor device 201 having the structure shown in FIG. 5 is obtained through the aforementioned steps.

According to this method, the P-type well region 220 of the NMOSFET 204 can be formed in the same step as the body region 209 of the VDMOSFET 203.

In addition to the aforementioned treatments, annealing for activating ions etc. is properly performed if necessary.

Figure 8:
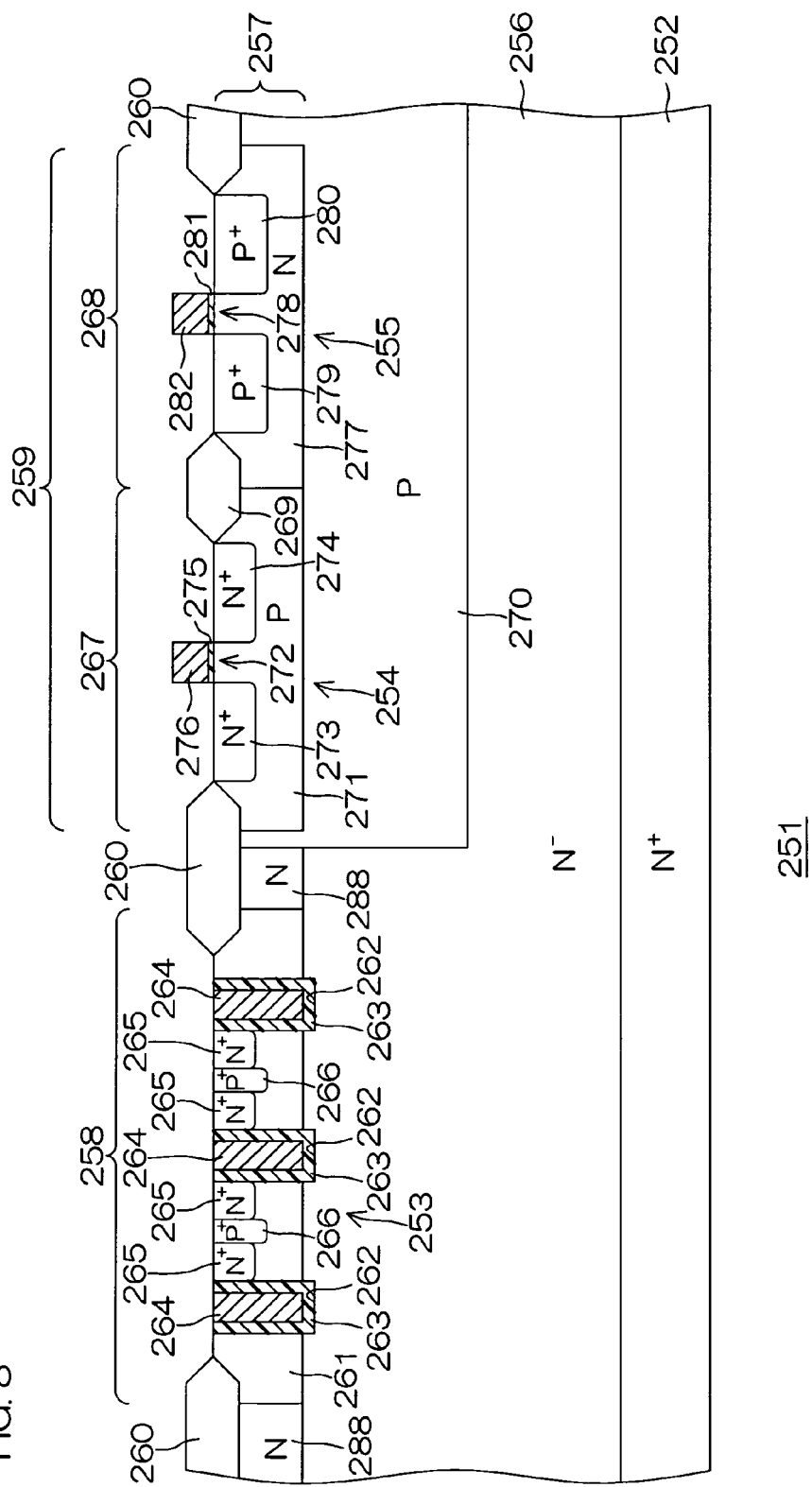
FIG. 8 is a schematic sectional view showing the structure of a semiconductor device according to a third embodiment of the present invention.

FIG. 8 is a schematic sectional view showing the structure of a semiconductor device 251 according to a third embodiment of the present invention.

The semiconductor device 251 includes a trench gate VDMOSFET 253 (hereinafter referred to as "VDMOSFET 253"), a planar gate N-channel MOSFET 254 (hereinafter referred to as "NMOSFET 254") and a planar gate P-channel MOSFET 255 (hereinafter referred to as "PMOSFET 255") on an N$^+$-type semiconductor substrate 252 made of silicon.

An N$^-$-type first epitaxial layer 256 made of silicon is formed on the semiconductor substrate 252. A P-type second epitaxial layer 257 made of silicon is formed on the first epitaxial layer 256. A LOCOS oxide film 260 for isolating a VDMOS forming region 258 and a CMOS forming region 259 from each other is formed on the surface of the second epitaxial layer 257. An N-type isolation region 288 is formed under the LOCOS oxide film 260, along the overall thickness of the second epitaxial layer 257.

The VDMOSFET 253 is formed in the VDMOS forming region 258. In the VDMOS forming region 258, the second epitaxial layer 257 forms a P-type body region 261. In the VDMOS forming region 258, further, trenches 262 are dug in the body region 261 from the surface thereof. The trenches 262 penetrate the body region 261, so that the deepest portions thereof reach the first epitaxial layer 256 under the body region 261. The plurality of trenches 262 are formed at regular intervals in the horizontal direction in FIG. 8, to extend in a direction (along the gate width) orthogonal to the plane of FIG. 8 respectively. Gate insulating films 263 are formed in the trenches 262, to cover the overall inner surfaces thereof. Gate electrodes 264 are embedded in the trenches 262 by filling up the gate insulating films 263 with polysilicon doped with an N-type impurity in a high concentration.

In a surface layer portion of the body region 261, an N$^+$-type source region 265 is formed on at least one side of each trench 262 in the direction (horizontal direction in FIG. 8) orthogonal to the gate width. The source region 265 extends along the trench 262 in the direction along the gate width. A P$^+$-type bodycontact region 266 is formed at thecenter of the source region 265 in the direction orthogonal to the gate width, to penetrate the source region 265.

The NMOSFET 254 and the PMOSFET 255 are formed in the CMOS forming region 259. More specifically, a LOCOS oxide film 269 for isolating an NMOS forming region 267 and a PMOS forming region 268 from each other is formed on the surface of the second epitaxial layer 257 in the CMOS forming region 259, and the NMOSFET 254 and the PMOSFET 255 are formed in the NMOS forming region 267 and the PMOS forming region 268 respectively.

In the CMOS forming region 259, a P-type deep well region 270 is formed in a surface layer portion of the first epitaxial layer 256.

In the NMOS forming region 267, the second epitaxial layer 257 forms a P-type well region 271. N$^+$-type source and drain regions 273 and 274 are formed in a surface layer portion of the P-type well region 271 through a channel region 272.

A gate insulating film 275 made of SiO$_2$ is formed on the channel region 272. A gate electrode 276 made of polysilicon dopedwith an N-type impurity in a high concentration is formed on the gate insulating film 275.

In the PMOS forming region 268, an N-type well region 277 is formed on the second epitaxial layer 257 along the overall thickness of the second epitaxial layer 257. P$^+$-type source and drain regions 279 and 280 are formed in a surface layer portion of the N-type well region 277 through a channel region 278.

A gate insulating film 281 made of SiO$_2$ is formed on the channel region 278. A gate electrode 282 made of polysilicon dopedwith an N-type impurity in a high concentration is formed on the gate insulating film 281.

FIGS. 9A to 9J are schematic sectional views for illustrating a method of manufacturing the semiconductor device 251 shown in FIG. 8.

Figure 9A:
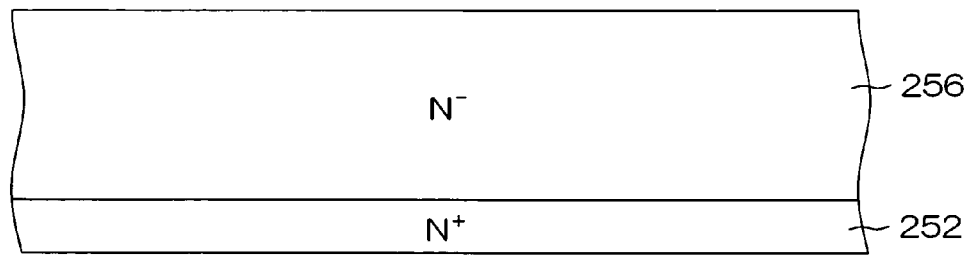
FIG. 9A is a schematic sectional view for illustrating a method of manufacturing the semiconductor device shown in FIG. 8.

First, the first epitaxial layer 256 is formed on the semiconductor substrate 252 by epitaxy, as shown in FIG. 9A.

Figure 9B:
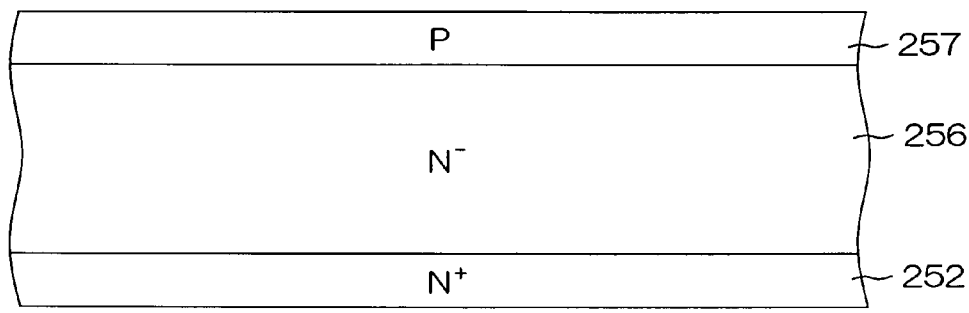
FIGS. 9B to 9J are schematic sectional views successively showing the steps subsequent to the step shown in FIG. 9A.

Then, the second epitaxial layer 257 is formed on the first epitaxial layer 256 by epitaxy, as shown in FIG. 9B.

Figure 9C:
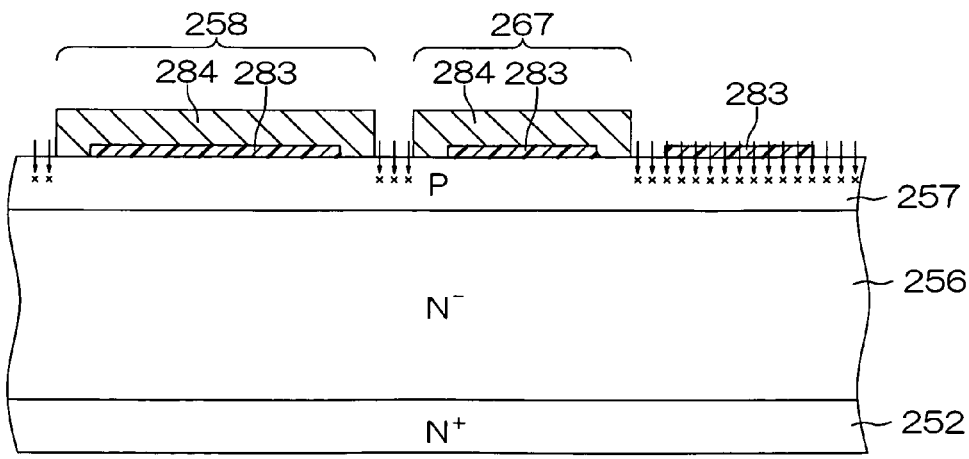

Thereafter an SiN film 283 having openings opposed to the portions for forming the LOCOS oxide films 260 and 269 is formed on the second epitaxial layer 257 by CVD, as shown in FIG. 9C. Then, region isolation films 284 opposed to the VDMOS forming region 258 and the NMOS forming region 267 are formed on the second epitaxial layer 257 and the SiN film 283 by CVD. Then, an N-type impurity is implanted into the second epitaxial layer 257 from the surface thereof through the region isolation films 284 serving as masks.

Figure 9D:
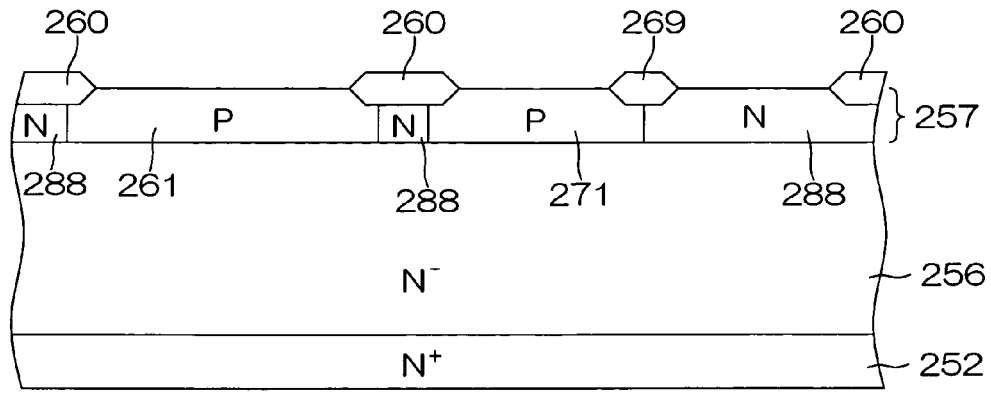

Thus, the isolation region 288 is formed in the second epitaxial layer 257, as shown in FIG. 9D. This isolation region 288 divides the second epitaxial layer 257 into the body region 261 and the region including the P-type well region 271. The region isolation films 284 are removed after the isolation of the body region 261 and the P-type well region 271. Thereafter the LOCOS oxide films 260 and 269 are selectively formed on the surface of the second epitaxial layer 257 by LOCOS. The SiN film 283 is removed after the formation of the LOCOS oxide films 260 and 269.

Figure 9E:
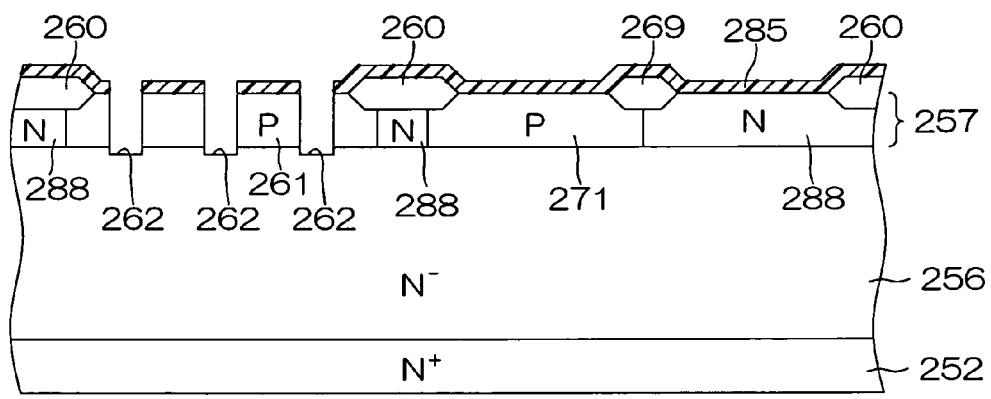

Then, an SiN layer is formed on the surface of the second epitaxial layer 257 by CVD. This SiN layer is patterned by photolithography, thereby forming a hard mask 285 having an opening opposed to the portion for forming each trench 262, as shown in FIG. 9E. Thereafter the second epitaxial layer 257 and the first epitaxial layer 256 are etched through the hard mask 285, thereby forming each trench 262.

Figure 9F:
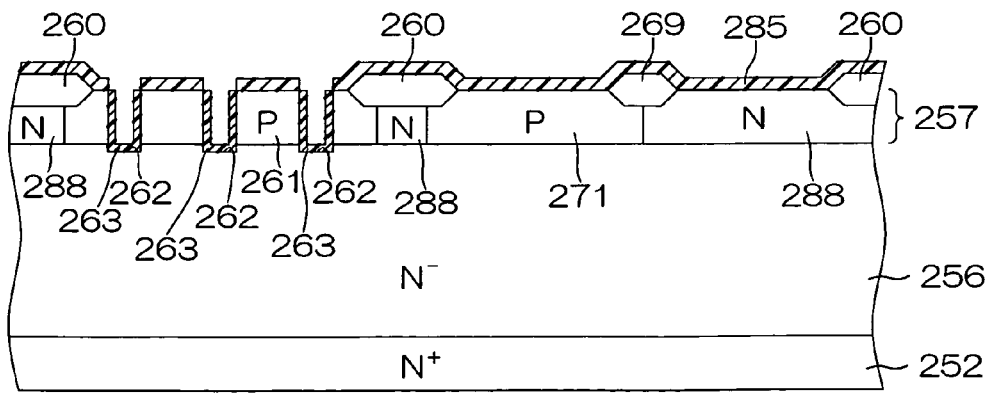

Then, thermal oxidation is performed while leaving the hard mask 285 on the second epitaxial layer 257, thereby forming the gate insulating film 263 on the inner surface of the trench 262, as shown in FIG. 9F.

Figure 9G:
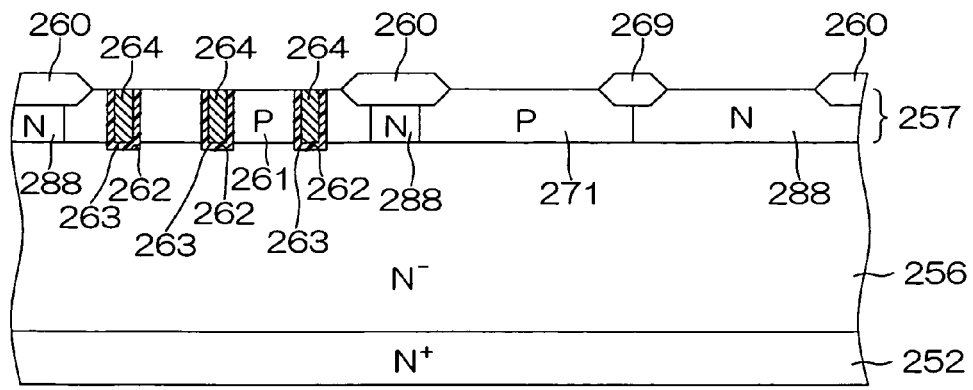

Then, a deposition layer (not shown) of polysilicon doped with an N-type impurity in a high concentration is formed onthe gate insulating film 263 by CVD. The trench 262 is filled up with the deposition layer of polysilicon. Then, the portion of the deposition layer of polysilicon located outside the trench 262 is removed by etch-back. Thus, the gate electrode 264 embedded in the trench 262 through the gate insulating film 263 is obtained, as shown in FIG. 9G. The hard mask 285 is removed after the formation of the gate electrode 264. Thus, the surface of the second epitaxial layer 257 is exposed.

Figure 9H:
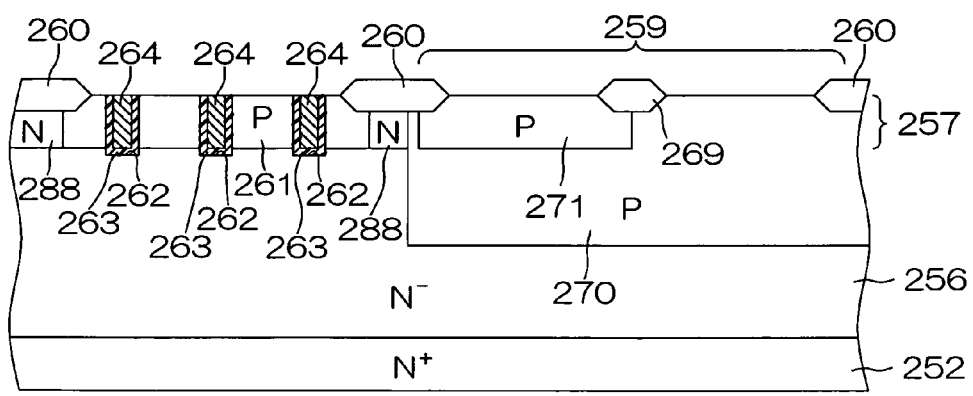

Thereafter a resist film (not shown) having an opening opposed to the CMOS forming region 259 is formed on the second epitaxial layer 257 by photolithography, as shown in FIG. 9H. Then, a P-type impurity is implanted into the second epitaxial layer 257 from the surface thereof through the resist film serving as a mask, thereby forming the deep well region 270. The resist film is removed after the implantation of the P-type impurity.

Figure 9I:
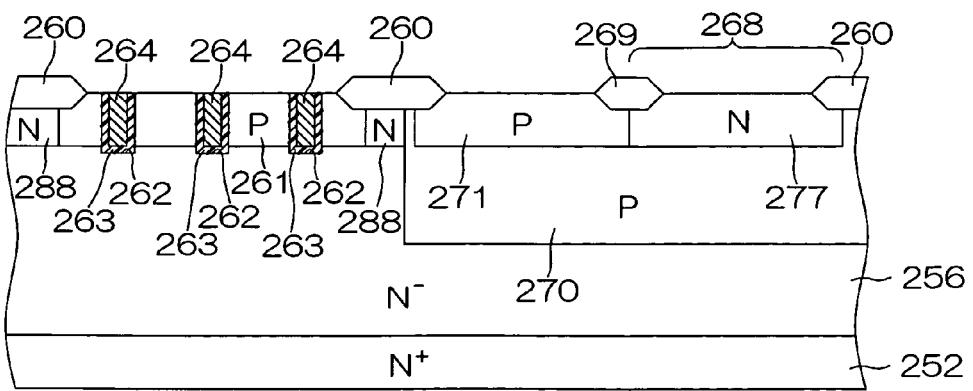

Then, another resist film (not shown) having an opening opposed to the PMOS forming region 268 is formed on the second epitaxial layer 257 by photolithography, as shown in FIG. 9I. Then, an N-type impurity is implanted into the second epitaxial layer 257 from the surface thereof through the resist film serving as a mask, thereby forming the N-type well region 277. The resist film is removed after the implantation of the N-type impurity.

Figure 9J:
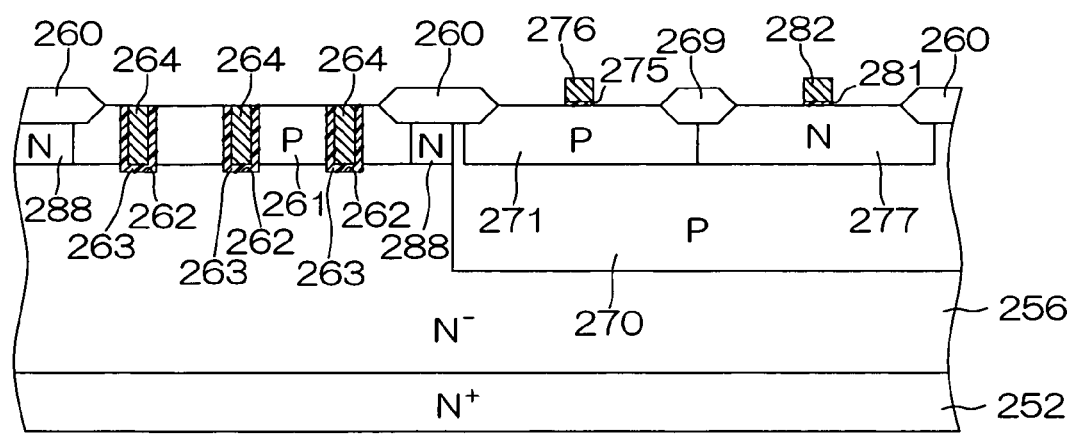

Thereafter an SiO$_2$ film (not shown) is formed on the surface of the second epitaxial layer 257 by thermal oxidation. Then, a polysilicon film (not shown) is formed on the SiO$_2$ film by thermal CVD. Thereafter the SiO$_2$ film and the polysilicon film are selectively removed by photolithography and etching. Thus, the gate insulating films 275 and 281 and the gate electrodes 276 and 282 are formed as shown in FIG. 9J.

Thereafter an N-type impurity is implanted in a high concentration into the portions for forming the source regions 265 and 273 and the drain region 274. Further, a P-type impurity is implanted in a high concentration into the portions for forming the body contact region 266, the source region 279 and the drain region 280. Thus, the source regions 265, 273 and 279, the drain regions 274 and 280 and the body contact region 266 are formed.

The semiconductor device 251 having the structure shown in FIG. 8 is obtained through the aforementioned steps.

According to this method, the N$^-$-type first epitaxial layer 256 is formed, and the P-type second epitaxial layer 257 is thereafter formed on the first epitaxial layer 256 by epitaxy. Thereafter the N-type impurity is selectively implanted into the second epitaxial layer 257, thereby forming the P-type body region 261 of the VDMOSFET 253 an the P-type well region 271 of the NMOSFET 254 isolatedly from each other.

The second epitaxial layer 257 formed by epitaxy has a generally uniform impurity concentration in the depth direction (thickness direction) thereof. Thus, the bottom portion of the body region 261 consisting of part of the second epitaxial layer 257 has an impurity concentration generally identical to that of the surface layer portion. Therefore, the impurity concentration of the bottom portion can be increased without increasing the peak concentration (peak value of the impurity concentration) of the body region 261 as compared with a case of forming the body region 261 by implantation and diffusion of an impurity. Consequently, spreading of a depletion layer from the interface between the N$^-$-type first epitaxial layer 256 and the P-type body region 261 toward the body region 261 can be suppressed, whereby the width (depth) of the depletion layer formed in the body region 261 can be reduced.

The width of the depletion layer formed in the body region 261 can be so reduced that the depth of the body region 261 can be reduced. Thus, the depth of the trench 262 formed to penetrate the body region 261 can be reduced, whereby portions around the upper and lower ends of the trench 262 can be prevented from action of remarkable stress, and occurrence of crystal defects resulting from stress can be prevented. Further, the channel length (gate length) can be so reduced that the on-resistance of the VDMOSFET 253 can be reduced.

In addition, the P-type well region 271 of the MOSFET 254 can be formed in the same step as the body region 261 of the VDMOSFET 253, whereby the manufacturing steps can be simplified.

In addition to the aforementioned treatments, annealing for activating ions etc. is properly performed if necessary.

The conductivity types of the semiconductor portions of the semiconductor devices 1, 201 and 251 may be reversed. In other words, the P-type portions may be converted to N-type portions and vice versa in the semiconductor devices 1, 201 and 251.

While the semiconductor layers 234 and 240 and the second epitaxial layer 257 are formed by epitaxy, the same may alternatively be formed by CVD. The semiconductor layers 234 and 240 and the second epitaxial layer 257 exhibit generally uniform impurity concentrations in the depth directions (thickness directions) thereof, also when the same are formed by CVD.

While the present invention has been described in detail byway of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-251828 filed in the Japanese Patent Office on Sep. 27, 2007, Japanese Patent Application No. 2007-255650 filed in the Japanese Patent Office on Sep. 28, 2007 and Japanese Patent Application No. 2008-228501 filed in the Japanese Patent Office on Sep. 5, 2008, the disclosures of which are incorporated herein by reference in its entirety.

What is claimed is:

1. A semiconductor device comprising:
a semiconductor layer of a first conductivity type;
a body region of a second conductivity type formed in a surface layer portion of the semiconductor layer;
a trench dug from the surface of the semiconductor layer to penetrate the body region;
a source region of a first conductivity type formed on a side portion of the trench in a surface layer portion of the body region;
a gate insulating film formed on the bottom surface and the side surface of the trench;
a gate electrode embedded in the trench through the gate insulating film and so formed that a bottom surface of the gate electrode is in contact with the bottom surface of the trench via the gate insulating film, and a top surface of the gate electrode is lower by one stage than the surface of the source region;
a peripheral wall film formed on a peripheral edge portion of the top surface of the gate electrode to be opposed to an upper end portion of the side surface of the trench, to cover said peripheral edge portion and to expose remaining portion of the top surface of the gate electrode;
an element isolation portion formed on the surface of the semiconductor layer for isolating a first element forming region and a second element forming region from each other, wherein the body region is formed in the first element forming region; and
a planar gate MOSFET (Metal Oxide Semiconductor Field-Effect Transistor) formed in the second element forming region.

2. The semiconductor device according to claim 1, wherein the planar gate MOSFET comprises:
a planar gate electrode formed on the surface of the semiconductor layer in the second element forming region; and
a sidewall surrounding the planar gate electrode to cover the side surface of the planar gate electrode.

3. The semiconductor device according to claim 2, wherein the peripheral wall film and the sidewall are made of a same material.

4. The semiconductor device according to claim 1, further comprising:

a deep well region of a second conductivity type formed in the surface layer portion of the semiconductor layer in the second element forming region;

a first well region of a first conductivity type formed in a surface layer portion of the deep well region; and a second well region of a second conductivity type formed in the surface layer portion of the deep well region isolatedly from the first well region.

5. The semiconductor device according to claim 4, wherein the deep well region has a greater depth than the body region.

6. The semiconductor device according to claim 4, wherein the first well region of the first conductivity type has substantially the same depth as the body region.

7. The semiconductor device according to claim 4, wherein the second well region of the second conductivity type has substantially the same depth as the body region.

8. The semiconductor device according to claim 4, wherein the first well region of the first conductivity type and the second well region of the second conductivity type have substantially the same depth as the body region.

9. The semiconductor device according to claim 1, wherein a deepest portion of the trench reaches the semiconductor layer of the first conductivity type.

10. The semiconductor device according to claim 1, further comprising a body contact region of the second conductivity type formed in the source region.

11. The semiconductor device according to claim 1, further comprising a body contact region of the second conductivity type formed at a center of the source region to penetrate the source region.

12. The semiconductor device according to claim 1, wherein at least the peripheral wall film is interposed between the gate electrode and the source region.

13. The semiconductor device according to claim 1, wherein a bottom portion of the body region has an impurity concentration substantially identical to that of a surface layer portion of the body region.

* * * * *